(12) United States Patent
Rohl et al.

(10) Patent No.: US 12,284,791 B2
(45) Date of Patent: Apr. 22, 2025

(54) SYSTEMS AND METHODS FOR COOLING SYSTEM AND POWER MODULE FOR INVERTER FOR ELECTRIC VEHICLE

(71) Applicant: BorgWarner US Technologies LLC, Wilmington, DE (US)

(72) Inventors: Bryan Rohl, Westfield, IN (US); Chris Fruth, Kokomo, IN (US)

(73) Assignee: BorgWarner US Technologies LLC, Wilmington, DE (US)

( * ) Notice: Subject to any disclaimer, the term of this patent is extended or adjusted under 35 U.S.C. 154(b) by 301 days.

(21) Appl. No.: 18/160,390

(22) Filed: Jan. 27, 2023

(65) Prior Publication Data

US 2024/0107720 A1 Mar. 28, 2024

Related U.S. Application Data

(60) Provisional application No. 63/378,601, filed on Oct. 6, 2022, provisional application No. 63/377,486, filed on (Continued)

(51) Int. Cl.
*H05K 7/14* (2006.01)
*B60L 3/00* (2019.01)
(Continued)

(52) U.S. Cl.
CPC .......... *H05K 7/20927* (2013.01); *B60L 3/003* (2013.01); *B60L 15/007* (2013.01);
(Continued)

(58) Field of Classification Search
CPC .......... H05K 7/20927; H05K 7/20154; H05K 7/2039; H05K 7/2049; H05K 7/20854;
(Continued)

(56) References Cited

U.S. PATENT DOCUMENTS

| 4,054,828 A | 10/1977 | Conzelmann et al. |
| 4,128,801 A | 12/1978 | Gansert et al. |

(Continued)

FOREIGN PATENT DOCUMENTS

| KR | 20140130862 A | * 11/2014 | .......... H05K 7/2089 |
| KR | 20170112813 A | 10/2017 | |

(Continued)

OTHER PUBLICATIONS

Balogh, L., "Fundamentals of MOSFET and IGBT Gate Driver Circuits," Texas Instruments Application Report, SLUA618—Mar. 2017, Retrieved from internet URL: https://ghioni.faculty.polimi.it/pel/readmat/gate-drive.pdf, 65 pages.

(Continued)

*Primary Examiner* — Zhengfu J Feng
(74) *Attorney, Agent, or Firm* — Joshua M. Haines; Bookoff McAndrews, PLLC

(57) ABSTRACT

A base for an electrical component includes: a body, the body defining: a rim, pin slots, and first engagement slots; contact terminals; and electrical connectors, each of the electrical connectors being positioned within a respective pin slot and including a pin terminal positioned on a first surface of the body; wherein the base is configured to provide an electrical connection between one or more power modules and a substrate.

20 Claims, 15 Drawing Sheets

Related U.S. Application Data on Sep. 28, 2022, provisional application No. 63/377,501, filed on Sep. 28, 2022, provisional application No. 63/377,512, filed on Sep. 28, 2022.

(51) Int. Cl.

| | | |
|---|---|---|
| *B60L 15/00* | (2006.01) | |
| *B60L 15/08* | (2006.01) | |
| *B60L 50/40* | (2019.01) | |
| *B60L 50/51* | (2019.01) | |
| *B60L 50/60* | (2019.01) | |
| *B60L 50/64* | (2019.01) | |
| *B60L 53/20* | (2019.01) | |
| *B60L 53/22* | (2019.01) | |
| *B60L 53/62* | (2019.01) | |
| *B60R 16/02* | (2006.01) | |
| *G01R 15/20* | (2006.01) | |
| *G06F 1/08* | (2006.01) | |
| *G06F 13/40* | (2006.01) | |
| *H01L 21/48* | (2006.01) | |
| *H01L 23/00* | (2006.01) | |
| *H01L 23/15* | (2006.01) | |
| *H01L 23/367* | (2006.01) | |
| *H01L 23/373* | (2006.01) | |
| *H01L 23/40* | (2006.01) | |
| *H01L 23/467* | (2006.01) | |
| *H01L 23/473* | (2006.01) | |
| *H01L 23/495* | (2006.01) | |
| *H01L 23/538* | (2006.01) | |
| *H01L 25/00* | (2006.01) | |
| *H01L 25/07* | (2006.01) | |
| *H02J 7/00* | (2006.01) | |
| *H02M 1/00* | (2006.01) | |
| *H02M 1/08* | (2006.01) | |
| *H02M 1/084* | (2006.01) | |
| *H02M 1/088* | (2006.01) | |
| *H02M 1/12* | (2006.01) | |
| *H02M 1/32* | (2007.01) | |
| *H02M 1/42* | (2007.01) | |
| *H02M 1/44* | (2007.01) | |
| *H02M 3/335* | (2006.01) | |
| *H02M 7/00* | (2006.01) | |
| *H02M 7/537* | (2006.01) | |
| *H02M 7/5387* | (2007.01) | |
| *H02M 7/5395* | (2006.01) | |
| *H02P 27/06* | (2006.01) | |
| *H02P 27/08* | (2006.01) | |
| *H02P 29/024* | (2016.01) | |
| *H02P 29/68* | (2016.01) | |
| *H05K 1/14* | (2006.01) | |
| *H05K 1/18* | (2006.01) | |
| *H05K 5/02* | (2006.01) | |
| *H05K 7/20* | (2006.01) | |
| *H10D 64/01* | (2025.01) | |
| *B60L 15/20* | (2006.01) | |
| *H03K 19/20* | (2006.01) | |

(52) U.S. Cl.
CPC .............. *B60L 15/08* (2013.01); *B60L 50/40* (2019.02); *B60L 50/51* (2019.02); *B60L 50/60* (2019.02); *B60L 50/64* (2019.02); *B60L 53/20* (2019.02); *B60L 53/22* (2019.02); *B60L 53/62* (2019.02); *B60R 16/02* (2013.01); *G01R 15/20* (2013.01); *G06F 1/08* (2013.01); *G06F 13/4004* (2013.01); *H01L 21/4882* (2013.01); *H01L 23/15* (2013.01); *H01L 23/3672* (2013.01); *H01L 23/3675* (2013.01); *H01L 23/3735* (2013.01); *H01L 23/4006* (2013.01); *H01L 23/467* (2013.01); *H01L 23/473* (2013.01); *H01L 23/49562* (2013.01); *H01L 23/5383* (2013.01); *H01L 24/32* (2013.01); *H01L 24/33* (2013.01); *H01L 25/072* (2013.01); *H01L 25/50* (2013.01); *H02J 7/0063* (2013.01); *H02M 1/0009* (2021.05); *H02M 1/0054* (2021.05); *H02M 1/08* (2013.01); *H02M 1/084* (2013.01); *H02M 1/088* (2013.01); *H02M 1/123* (2021.05); *H02M 1/32* (2013.01); *H02M 1/322* (2021.05); *H02M 1/327* (2021.05); *H02M 1/4258* (2013.01); *H02M 1/44* (2013.01); *H02M 3/33523* (2013.01); *H02M 7/003* (2013.01); *H02M 7/537* (2013.01); *H02M 7/5387* (2013.01); *H02M 7/53871* (2013.01); *H02M 7/53875* (2013.01); *H02M 7/5395* (2013.01); *H02P 27/06* (2013.01); *H02P 27/08* (2013.01); *H02P 27/085* (2013.01); *H02P 29/024* (2013.01); *H02P 29/027* (2013.01); *H02P 29/68* (2016.02); *H05K 1/145* (2013.01); *H05K 1/181* (2013.01); *H05K 1/182* (2013.01); *H05K 5/0247* (2013.01); *H05K 7/20154* (2013.01); *H05K 7/2039* (2013.01); *H05K 7/2049* (2013.01); *H05K 7/20854* (2013.01); *H05K 7/209* (2013.01); *H10D 64/018* (2025.01); *B60L 15/20* (2013.01); *B60L 2210/30* (2013.01); *B60L 2210/40* (2013.01); *B60L 2210/42* (2013.01); *B60L 2210/44* (2013.01); *B60L 2240/36* (2013.01); *G06F 2213/40* (2013.01); *H01L 2023/405* (2013.01); *H01L 2023/4087* (2013.01); *H01L 2224/32225* (2013.01); *H01L 2224/32245* (2013.01); *H01L 2224/33181* (2013.01); *H02J 2207/20* (2020.01); *H02P 2207/05* (2013.01); *H03K 19/20* (2013.01); *H05K 2201/042* (2013.01); *H05K 2201/10166* (2013.01)

(58) Field of Classification Search
CPC ........ H05K 7/209; H05K 1/145; H05K 1/181; H05K 1/182; H05K 5/0247; H05K 2201/042; H05K 2201/1016; B60L 3/003; B60L 15/007; B60L 15/08; B60L 15/20; B60L 50/40; B60L 50/51; B60L 50/60; B60L 50/64; B60L 53/20; B60L 53/22; B60L 53/62; B60L 2210/30; B60L 2210/40; B60L 2210/42; B60L 2210/44; B60L 3/0084; B60R 16/02; G01R 15/20; G06F 1/08; G06F 13/4004; G06F 2213/40; H01L 21/4882; H01L 23/15; H01L 23/3672; H01L 23/3675; H01L 23/3735; H01L 23/4006; H01L 23/467; H01L 23/473; H01L 23/49562; H01L 23/5383; H01L 24/32; H01L 24/33; H01L 25/072; H01L 25/50; H01L 2023/405; H01L 2023/4087; H01L 2224/32225; H01L 2224/32245; H01L 2224/33181; H02J 7/0063; H02J 2207/20; H02M 1/0009; H02M 1/0054; H02M 1/08; H02M 1/084; H02M 1/088; H02M 1/123; H02M 1/32; H02M 1/322; H02M 1/327; H02M 1/4258; H02M 1/44; H02M 7/003; H02M 7/537; H02M 7/5387; H02M 7/53871; H02M 7/53875; H02M 7/5395;

H02P 27/06; H02P 27/08; H02P 27/085; H02P 29/024; H02P 29/027; H02P 29/68; H02P 2207/05; H10D 64/018; H03K 19/20

USPC .......................................................... 361/704

See application file for complete search history.

(56) References Cited

U.S. PATENT DOCUMENTS

| | | | |
|---|---|---|---|
| 4,564,771 | A | 1/1986 | Flohrs |
| 4,618,875 | A | 10/1986 | Flohrs |
| 4,716,304 | A | 12/1987 | Fiebig et al. |
| 5,068,703 | A | 11/1991 | Conzelmann et al. |
| 5,432,371 | A | 7/1995 | Denner et al. |
| 5,559,661 | A | 9/1996 | Meinders |
| 5,654,863 | A | 8/1997 | Davies |
| 5,764,007 | A | 6/1998 | Jones |
| 5,841,312 | A | 11/1998 | Mindl et al. |
| 6,028,470 | A | 2/2000 | Michel et al. |
| 6,163,138 | A | 12/2000 | Kohl et al. |
| 6,351,173 | B1 | 2/2002 | Ovens et al. |
| 6,426,857 | B1 | 7/2002 | Doster et al. |
| 6,442,023 | B2 | 8/2002 | Cettour-Rose et al. |
| 6,597,556 | B1 | 7/2003 | Michel et al. |
| 6,812,553 | B2 | 11/2004 | Gerbsch et al. |
| 6,943,293 | B1 | 9/2005 | Jeter et al. |
| 7,095,098 | B2 | 8/2006 | Gerbsch et al. |
| 7,229,855 | B2 | 6/2007 | Murphy |
| 7,295,433 | B2 * | 11/2007 | Taylor ............... H05K 7/20872 361/689 |
| 7,459,954 | B2 | 12/2008 | Kuehner et al. |
| 7,538,425 | B2 | 5/2009 | Myers et al. |
| 7,551,439 | B2 * | 6/2009 | Peugh ................. H01L 23/473 174/15.1 |
| 7,616,047 | B2 | 11/2009 | Rees et al. |
| 7,724,046 | B2 | 5/2010 | Wendt et al. |
| 7,750,720 | B2 | 7/2010 | Dittrich |
| 9,088,159 | B2 | 7/2015 | Peuser |
| 9,275,915 | B2 | 3/2016 | Heinisch et al. |
| 9,373,970 | B2 | 6/2016 | Feuerstack et al. |
| 9,431,932 | B2 | 8/2016 | Schmidt et al. |
| 9,515,584 | B2 | 12/2016 | Koller et al. |
| 9,548,675 | B2 | 1/2017 | Schoenknecht |
| 9,806,607 | B2 | 10/2017 | Ranmuthu et al. |
| 9,843,320 | B2 | 12/2017 | Richter et al. |
| 9,871,444 | B2 | 1/2018 | Ni et al. |
| 9,882,490 | B2 | 1/2018 | Veeramreddi et al. |
| 9,936,580 | B1 * | 4/2018 | Vinciarelli ........... B23K 1/0016 |
| 10,111,285 | B2 | 10/2018 | Shi et al. |
| 10,116,300 | B2 | 10/2018 | Blasco et al. |
| 10,232,718 | B2 | 3/2019 | Trunk et al. |
| 10,270,354 | B1 | 4/2019 | Lu et al. |
| 10,291,225 | B2 | 5/2019 | Li et al. |
| 10,525,847 | B2 | 1/2020 | Strobel et al. |
| 10,600,721 | B2 * | 3/2020 | Machler ................ H01L 23/473 |
| 10,797,579 | B2 | 10/2020 | Hashim et al. |
| 10,924,001 | B2 | 2/2021 | Li et al. |
| 11,082,052 | B2 | 8/2021 | Jang et al. |
| 11,108,389 | B2 | 8/2021 | Li et al. |
| 11,342,911 | B2 | 5/2022 | Lee et al. |
| 11,357,139 | B2 | 6/2022 | Lee et al. |
| 11,838,011 | B2 | 12/2023 | Li et al. |
| 11,843,320 | B2 | 12/2023 | Sivakumar et al. |
| 11,848,426 | B2 | 12/2023 | Zhang et al. |
| 11,851,038 | B2 | 12/2023 | Solanki et al. |
| 11,855,522 | B2 | 12/2023 | Rudolph et al. |
| 11,855,630 | B2 | 12/2023 | Dake et al. |
| 11,870,338 | B1 | 1/2024 | Narayanasamy |
| 11,872,997 | B2 | 1/2024 | Hoos et al. |
| 11,881,859 | B2 | 1/2024 | Gupta et al. |
| 11,888,391 | B2 | 1/2024 | Balasubramanian et al. |
| 11,888,393 | B2 | 1/2024 | Venkateswaran et al. |
| 11,901,803 | B2 | 2/2024 | Ruck et al. |
| 11,901,881 | B1 | 2/2024 | Narayanasamy |
| 11,909,319 | B2 | 2/2024 | Esteghlal et al. |
| 11,916,426 | B2 | 2/2024 | Oner et al. |
| 11,923,762 | B2 | 3/2024 | Sethumadhavan et al. |
| 11,923,764 | B1 | 3/2024 | Zhang |
| 11,923,799 | B2 | 3/2024 | Ojha et al. |
| 11,925,119 | B2 | 3/2024 | Male et al. |
| 11,927,624 | B2 | 3/2024 | Patel et al. |
| 11,938,838 | B2 | 3/2024 | Simonis et al. |
| 11,942,927 | B2 | 3/2024 | Purcarea et al. |
| 11,942,934 | B2 | 3/2024 | Ritter |
| 11,945,331 | B2 | 4/2024 | Blemberg et al. |
| 11,945,522 | B2 | 4/2024 | Matsumura et al. |
| 11,949,320 | B2 | 4/2024 | Jaladanki et al. |
| 11,949,333 | B2 | 4/2024 | Pahkala et al. |
| 11,955,896 | B2 | 4/2024 | Liu et al. |
| 11,955,953 | B2 | 4/2024 | Sinn et al. |
| 11,955,964 | B2 | 4/2024 | Agarwal et al. |
| 11,962,234 | B2 | 4/2024 | Narayanasamy et al. |
| 11,962,291 | B2 | 4/2024 | Oberdieck et al. |
| 11,964,587 | B2 | 4/2024 | Yukawa |
| 11,970,076 | B2 | 4/2024 | Sarfert et al. |
| 11,977,404 | B2 | 5/2024 | Chandrasekaran |
| 11,984,802 | B2 | 5/2024 | Merkin et al. |
| 11,984,876 | B2 | 5/2024 | Neidorff et al. |
| 11,990,776 | B2 | 5/2024 | Dulle |
| 11,990,777 | B2 | 5/2024 | Woll et al. |
| 11,996,686 | B2 | 5/2024 | Chan et al. |
| 11,996,699 | B2 | 5/2024 | Vasconcelos Araujo et al. |
| 11,996,714 | B2 | 5/2024 | El Markhi et al. |
| 11,996,715 | B2 | 5/2024 | Nandi et al. |
| 11,996,762 | B2 | 5/2024 | Hembach et al. |
| 11,996,830 | B2 | 5/2024 | Murthy et al. |
| 11,996,847 | B1 | 5/2024 | Kazama et al. |
| 12,003,191 | B2 | 6/2024 | Chaudhary et al. |
| 12,003,229 | B2 | 6/2024 | Kaya et al. |
| 12,003,237 | B2 | 6/2024 | Waters |
| 12,008,847 | B2 | 6/2024 | Braun et al. |
| 12,009,679 | B2 | 6/2024 | Gottwald et al. |
| 12,012,057 | B2 | 6/2024 | Schneider et al. |
| 12,015,342 | B2 | 6/2024 | Kienzler et al. |
| 12,019,112 | B2 | 6/2024 | Jarmolowitz et al. |
| 12,021,517 | B2 | 6/2024 | S et al. |
| 12,132,010 | B2 | 10/2024 | Coppola et al. |
| 12,144,147 | B2 | 11/2024 | Lee et al. |
| 2017/0094836 | A1 | 3/2017 | Lo et al. |
| 2017/0331469 | A1 | 11/2017 | Kilb et al. |
| 2019/0335608 | A1 * | 10/2019 | Song ................. H05K 7/20854 |
| 2020/0195121 | A1 | 6/2020 | Keskar et al. |
| 2021/0005711 | A1 | 1/2021 | Martinez-Limia et al. |
| 2021/0219465 | A1 | 7/2021 | Wang et al. |
| 2021/0337703 | A1 | 10/2021 | Lee et al. |
| 2022/0052610 | A1 | 2/2022 | Plum |
| 2022/0294441 | A1 | 9/2022 | Purcarea et al. |
| 2022/0369496 | A1 * | 11/2022 | Siewert ............. H05K 7/20927 |
| 2022/0404100 | A1 | 12/2022 | Vanderwees et al. |
| 2023/0010616 | A1 | 1/2023 | Gschwantner et al. |
| 2023/0061922 | A1 | 3/2023 | Ritter |
| 2023/0082076 | A1 | 3/2023 | Strache et al. |
| 2023/0126070 | A1 | 4/2023 | Oberdieck et al. |
| 2023/0179198 | A1 | 6/2023 | Winkler |
| 2023/0189487 | A1 | 6/2023 | Kwon et al. |
| 2023/0200008 | A1 | 6/2023 | Lee et al. |
| 2023/0231210 | A1 | 7/2023 | Joos et al. |
| 2023/0231400 | A1 | 7/2023 | Oberdieck et al. |
| 2023/0231496 | A1 | 7/2023 | Syed et al. |
| 2023/0238808 | A1 | 7/2023 | Swoboda et al. |
| 2023/0268826 | A1 | 8/2023 | Yan et al. |
| 2023/0335509 | A1 | 10/2023 | Poddar |
| 2023/0365086 | A1 | 11/2023 | Schumacher et al. |
| 2023/0370062 | A1 | 11/2023 | Wolf |
| 2023/0378022 | A1 | 11/2023 | Kim et al. |
| 2023/0386963 | A1 | 11/2023 | Kim et al. |
| 2023/0402930 | A1 | 12/2023 | Corry et al. |
| 2023/0420968 | A1 | 12/2023 | Oner et al. |
| 2023/0421049 | A1 | 12/2023 | Neidorff |
| 2024/0006869 | A1 | 1/2024 | Kim et al. |
| 2024/0006899 | A1 | 1/2024 | Wernerus |
| 2024/0006993 | A1 | 1/2024 | Barjati et al. |
| 2024/0022187 | A1 | 1/2024 | Fassnacht |
| 2024/0022240 | A1 | 1/2024 | Balaz |
| 2024/0022244 | A1 | 1/2024 | S et al. |

(56) References Cited

U.S. PATENT DOCUMENTS

| | | | |
|---|---|---|---|
| 2024/0030730 A1 | 1/2024 | Wernerus | |
| 2024/0032266 A1* | 1/2024 | Yamanoue | H05K 7/20936 |
| 2024/0039062 A1 | 2/2024 | Wernerus | |
| 2024/0039402 A1 | 2/2024 | Bafna et al. | |
| 2024/0039406 A1 | 2/2024 | Chen et al. | |
| 2024/0048048 A1 | 2/2024 | Zhang | |
| 2024/0055488 A1 | 2/2024 | Lee et al. | |
| 2024/0067116 A1 | 2/2024 | Qiu | |
| 2024/0072675 A1 | 2/2024 | Formenti et al. | |
| 2024/0072817 A1 | 2/2024 | K et al. | |
| 2024/0077899 A1 | 3/2024 | Chitnis et al. | |
| 2024/0078204 A1 | 3/2024 | Roehrle et al. | |
| 2024/0079950 A1 | 3/2024 | Narayanasamy | |
| 2024/0079958 A1 | 3/2024 | Kumar et al. | |
| 2024/0080028 A1 | 3/2024 | Dake et al. | |
| 2024/0088647 A1 | 3/2024 | Ramadass et al. | |
| 2024/0088896 A1 | 3/2024 | Bilhan et al. | |
| 2024/0097437 A1 | 3/2024 | Goyal et al. | |
| 2024/0097459 A1 | 3/2024 | Swoboda et al. | |
| 2024/0105276 A1 | 3/2024 | Duryea | |
| 2024/0106248 A1 | 3/2024 | Woll et al. | |
| 2024/0106435 A1 | 3/2024 | Zhang et al. | |
| 2024/0113517 A1 | 4/2024 | Sriraj et al. | |
| 2024/0113611 A1 | 4/2024 | Kaufmann et al. | |
| 2024/0113620 A1 | 4/2024 | Ranmuthu et al. | |
| 2024/0113624 A1 | 4/2024 | Southard et al. | |
| 2024/0120558 A1 | 4/2024 | Zhang et al. | |
| 2024/0120765 A1 | 4/2024 | Oner et al. | |
| 2024/0120962 A1 | 4/2024 | Miriyala et al. | |
| 2024/0128851 A1 | 4/2024 | Ruck et al. | |
| 2024/0128859 A1 | 4/2024 | Chen | |
| 2024/0128867 A1 | 4/2024 | Wang et al. | |
| 2024/0146177 A1 | 5/2024 | Mehdi et al. | |
| 2024/0146306 A1 | 5/2024 | Ramkaj et al. | |
| 2024/0149734 A1 | 5/2024 | Eisenlauer | |
| 2024/0162723 A1 | 5/2024 | Zipf et al. | |
| 2024/0178756 A1 | 5/2024 | El-Markhi et al. | |
| 2024/0178824 A1 | 5/2024 | Kazama et al. | |
| 2024/0186803 A1 | 6/2024 | Krieg et al. | |
| 2024/0198937 A1 | 6/2024 | Benqassmi et al. | |
| 2024/0198938 A1 | 6/2024 | Carlos et al. | |
| 2024/0204540 A1 | 6/2024 | Majmunovic et al. | |
| 2024/0204541 A1 | 6/2024 | Majmunovic et al. | |
| 2024/0204671 A1 | 6/2024 | Liu et al. | |
| 2024/0204765 A1 | 6/2024 | Dake | |
| 2024/0213874 A1 | 6/2024 | Junnarkar et al. | |
| 2024/0213971 A1 | 6/2024 | Lee | |
| 2024/0213975 A1 | 6/2024 | Narayanasamy | |
| 2024/0213981 A1 | 6/2024 | Agarwal et al. | |

FOREIGN PATENT DOCUMENTS

| | | |
|---|---|---|
| WO | 2007093598 A1 | 8/2007 |
| WO | 2019034505 A1 | 2/2019 |
| WO | 2020156820 A1 | 8/2020 |
| WO | 2020239797 A1 | 12/2020 |
| WO | 2021110405 A1 | 6/2021 |
| WO | 2021213728 A1 | 10/2021 |
| WO | 2022012943 A1 | 1/2022 |
| WO | 2022229149 A1 | 11/2022 |
| WO | 2023006491 A1 | 2/2023 |
| WO | 2023046607 A1 | 3/2023 |
| WO | 2023094053 A1 | 6/2023 |
| WO | 2023110991 A1 | 6/2023 |
| WO | 2023147907 A1 | 8/2023 |
| WO | 2023151850 A1 | 8/2023 |
| WO | 2023227278 A1 | 11/2023 |
| WO | 2023237248 A1 | 12/2023 |
| WO | 2024006181 A2 | 1/2024 |
| WO | 2024012743 A1 | 1/2024 |
| WO | 2024012744 A1 | 1/2024 |
| WO | 2024022219 A1 | 2/2024 |
| WO | 2024041776 A1 | 2/2024 |
| WO | 2024046614 A1 | 3/2024 |
| WO | 2024049730 A1 | 3/2024 |
| WO | 2024049884 A1 | 3/2024 |
| WO | 2024049909 A1 | 3/2024 |
| WO | 2024056388 A1 | 3/2024 |
| WO | 2024068065 A1 | 4/2024 |
| WO | 2024068076 A1 | 4/2024 |
| WO | 2024068113 A1 | 4/2024 |
| WO | 2024068115 A1 | 4/2024 |
| WO | 2024083391 A1 | 4/2024 |
| WO | 2024093384 A1 | 5/2024 |
| WO | 2024104970 A1 | 5/2024 |
| WO | 2024108401 A1 | 5/2024 |
| WO | 2024110106 A1 | 5/2024 |
| WO | 2024110265 A1 | 5/2024 |
| WO | 2024110297 A1 | 5/2024 |
| WO | 2024114978 A1 | 6/2024 |
| WO | 2024114979 A1 | 6/2024 |
| WO | 2024114980 A1 | 6/2024 |
| WO | 2024128286 A1 | 6/2024 |
| WO | 2024132249 A1 | 6/2024 |

OTHER PUBLICATIONS

Baranwal, S., "Common-mode transient immunity for isolated gate drivers," Analog Applications Journal, Texas Instruments (2015), Retrieved from internet URL: https://www.ti.com/lit/an/slyt648/slyt648.pdf?ts=1702052336068&ref_url=https%253A%252F%252Fwww.google.com%252F, 07 pages.

Boomer, K. and Ahmad H., "Performance Evaluation of an Automotive-Grade, High-Speed Gate Driver for SiC FETs, Type UCC27531, Over a Wide Temperature Range," NASA Electronic Parts and Packaging Program No. GRC-E-DAA-TN25898 (2015), Retrieved from Internet URL: https://ntrs.nasa.gov/api/citations/20150023034/downloads/20150023034.pdf, 08 pages.

Ke, X, et al., "A 3-to-40V 10-to-30MHz Automotive-Use GaN Driver with Active BST Balancing and VSW Dual-Edge Dead-Time Modulation Achieving 8.3% Efficiency Improvement and 3.4ns Constant Propagation Delay," 2016 IEEE International Solid-State Circuits Conference (ISSCC), IEEE, 2016, Retrieved from internet URL: https://picture.iczhiku.com/resource/ieee/WYkrsJrSQPoSjNXm.pdf, 03 pages.

Sridhar, N., "Impact of an Isolated Gate Driver," Texas Instruments: Dallas, Texas (2019), Retrieved from Internet URL: https://www.ti.com/lit/wp/slyy140a/slyy140a.pdf, 08 pages.

Sridhar, N., "Power Electronics in Motor Drives: Where is it?" Texas Instruments (2015), Retrieved from Internet URL: https://www.ti.com/lit/wp/slyy078a/slyy078a.pdf, 09 pages.

Sridhar, N., "Silicon Carbide Gate Drivers—a Disruptive Technology in Power Electronics," Texas Instruments, Dallas, Texas (2019), Retrieved from Internet URL: https://www.ti.com/lit/wp/slyy139/slyy139.pdf, 07 pages.

Maniar, K., et al., "Addressing High-voltage Design Challenges With Reliable and Affordable Isolation Technologies," 2024, pp. 1-12. Retrieved from internet URL: https://www.ti.com/lit/wp/slyy204c/slyy204c.pdf ts=1710508127616&ref_url=https%253A%252F%252Fwww.google.com%252F.

"New products," 5 Pages, Retrieved from internet URL:https://www.ti.com/product-category/new-products.html?%20releasePeriod=364#releasePeriod=90.

"Qualcomm and Bosch Showcase New Central Vehicle Computer for Digital Cockpit and Driver Assistance Functions at CES 2024," 2024, 8 Pages. Retrieved from internet URL:https://www.qualcomm.com/news/releases/2024/01/qualcomm-and-bosch-showcase-new-central-vehicle-computer-for-dig.

* cited by examiner

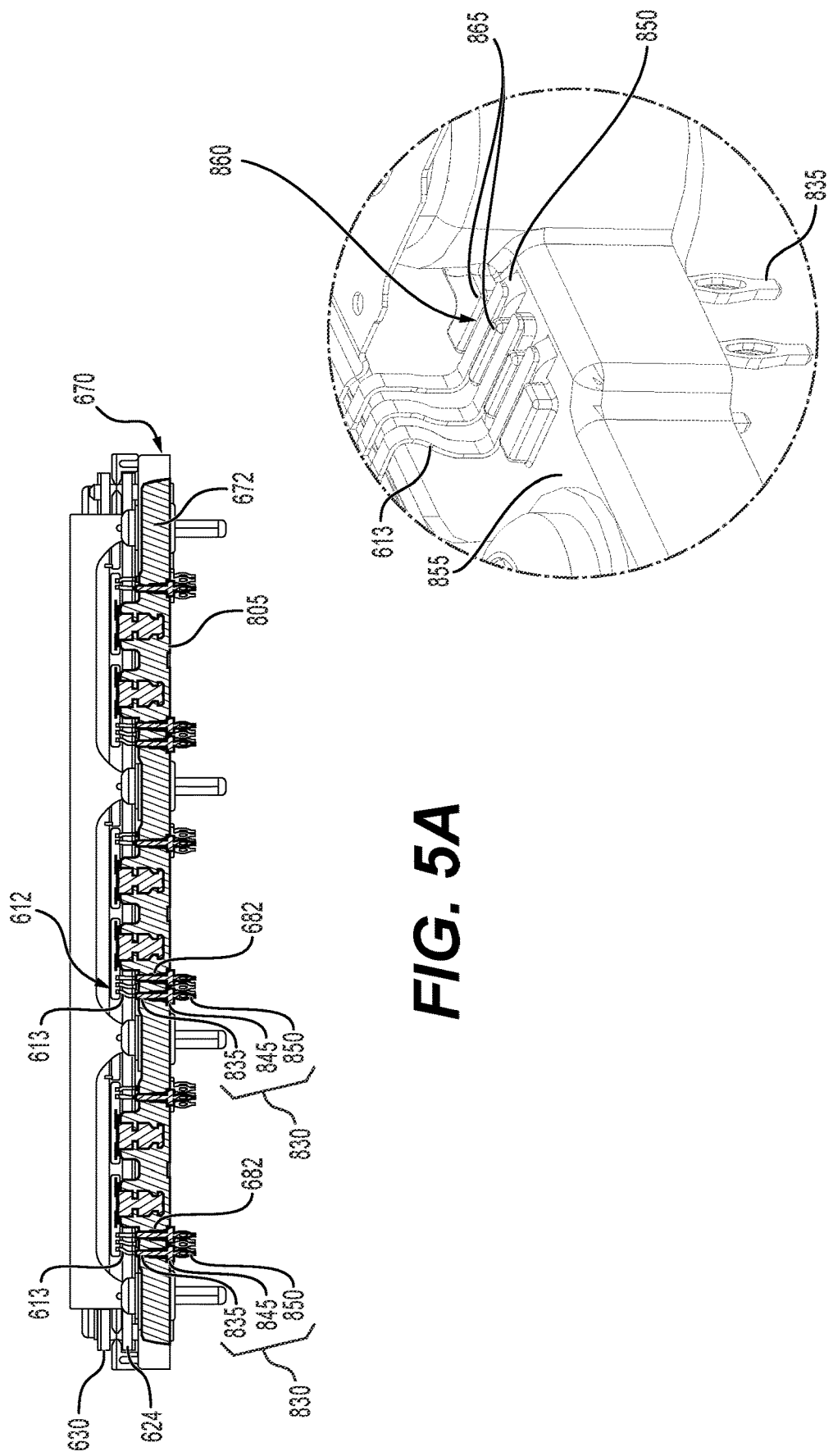

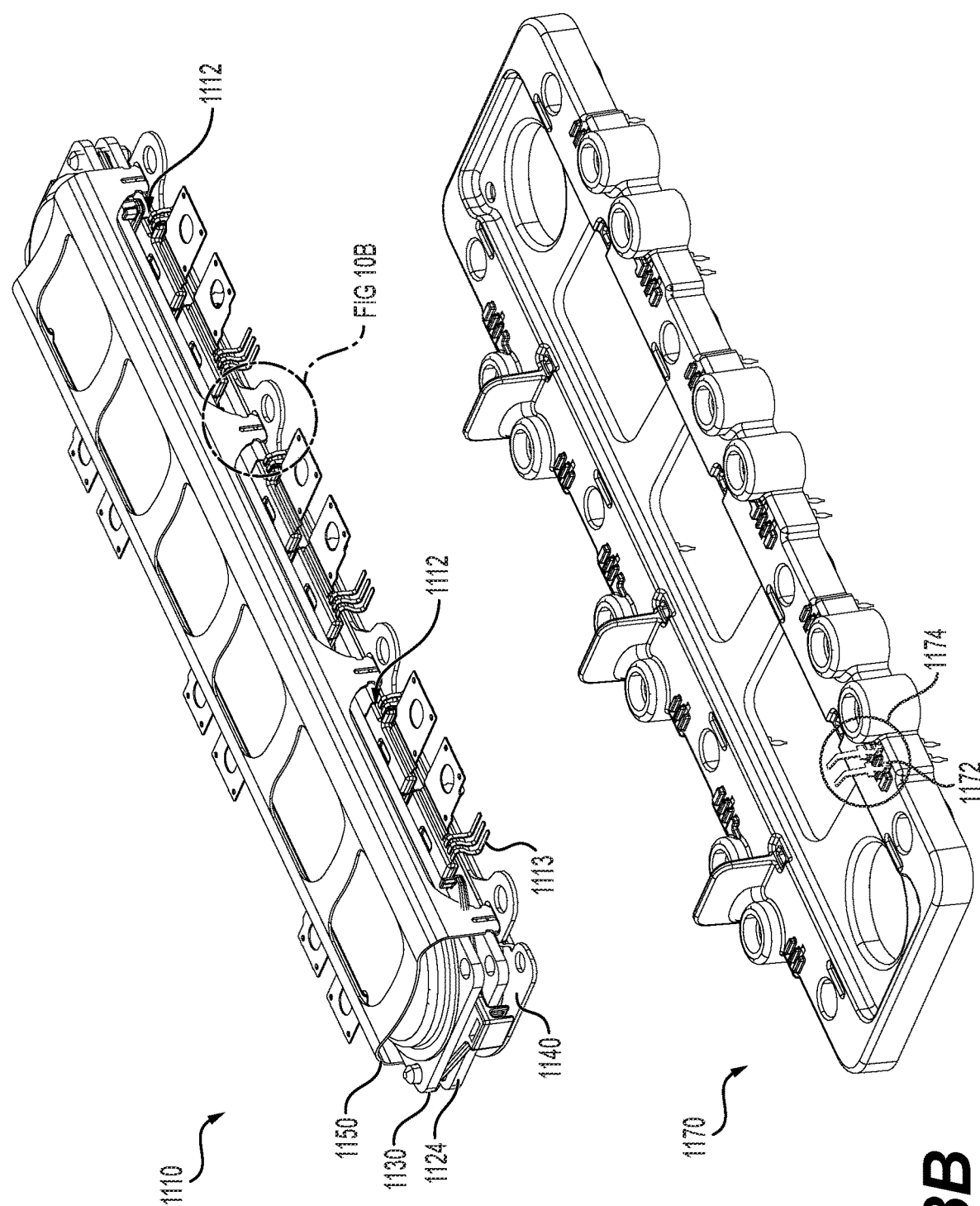

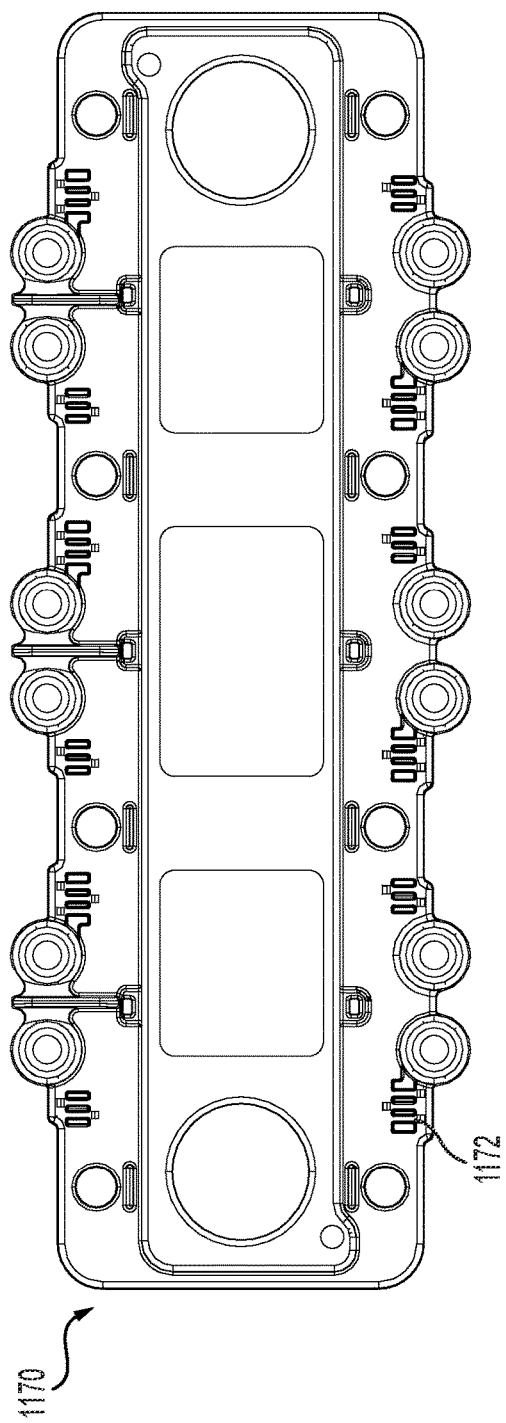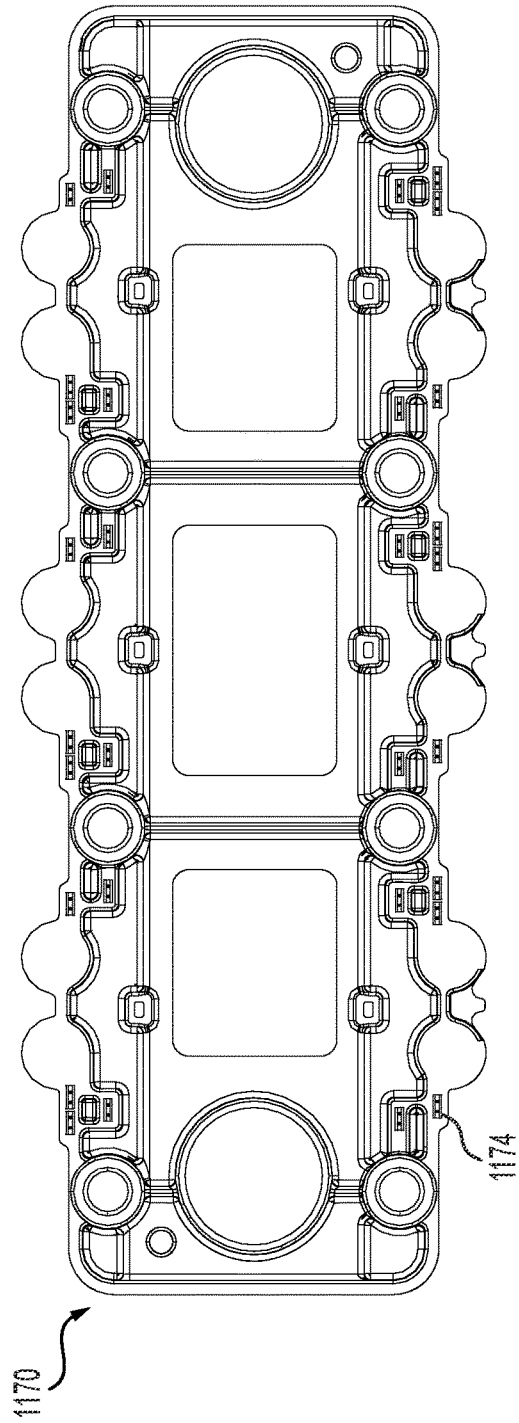

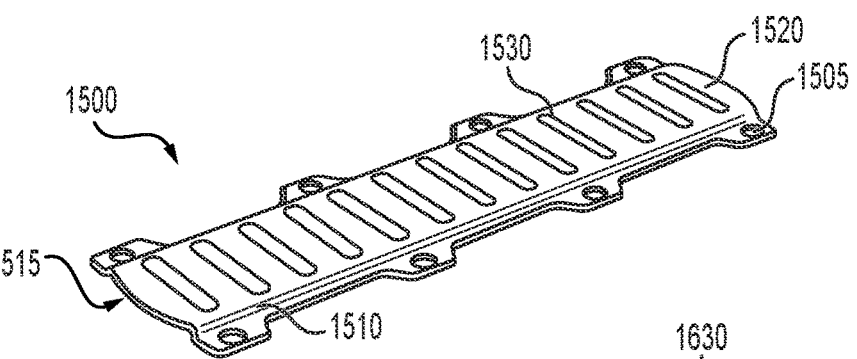
FIG. 12
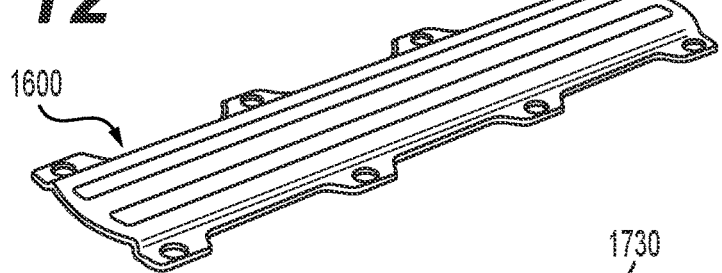
FIG. 13
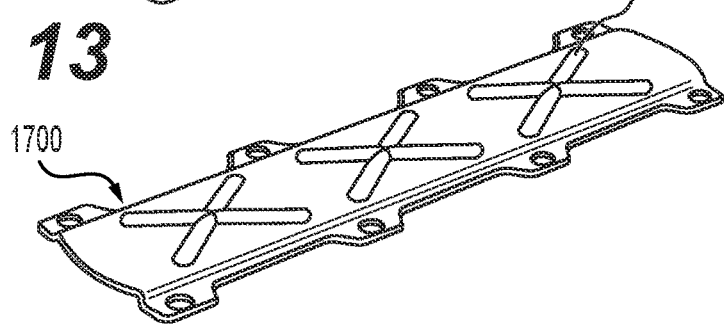
FIG. 14
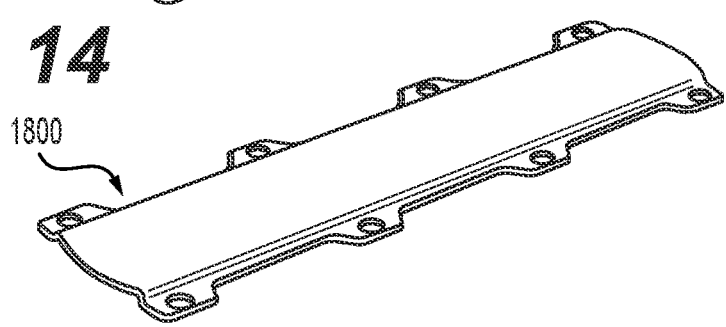
FIG. 15
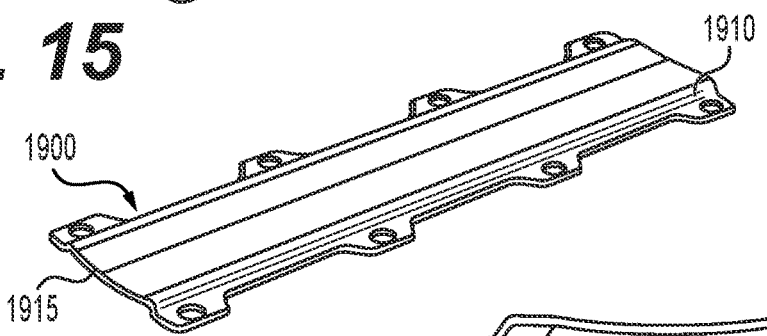 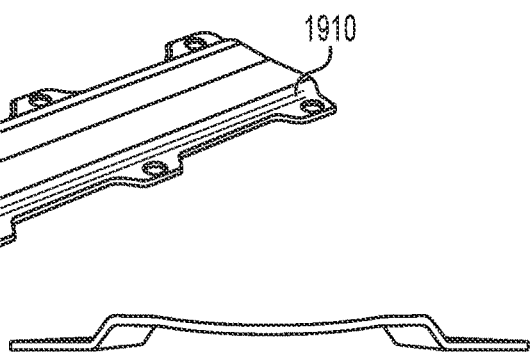
FIG. 16A    FIG. 16B

SYSTEMS AND METHODS FOR COOLING SYSTEM AND POWER MODULE FOR INVERTER FOR ELECTRIC VEHICLE

CROSS-REFERENCE TO RELATED APPLICATION(S)

This application claims the benefit of priority to U.S. Provisional Patent Application No. 63/377,486, filed Sep. 28, 2022, U.S. Provisional Patent Application No. 63/377,501, filed Sep. 28, 2022, U.S. Provisional Patent Application No. 63/377,512, filed Sep. 28, 2022, and U.S. Provisional Patent Application No. 63/378,601, filed Oct. 6, 2022, the entireties of which are incorporated by reference herein.

TECHNICAL FIELD

Various embodiments of the present disclosure relate generally to systems and methods that enable different processes for assembling, testing, and securing an electrical component. More particularly, various embodiments of the present disclosure relate to systems and methods that allow for different processes for assembling, testing, and securing power module assemblies that may be incorporated in inverters for electric vehicles.

BACKGROUND

Inverters, such as those used to drive a motor in an electric vehicle, for example, are responsible for converting High Voltage Direct Current (HVDC) into Alternating Current (AC) to drive the motor. Such inverters often implement power modules (power switches) that convert DC to AC power and vice versa. However, operation of these power modules may tend to generate high levels of heat. Heatsinks may provide effective means of dissipating heat by thermally conducting heat into a fluid medium, often via a utilization of Thermal Interface Material (TIM). Automotive cooling systems, for example, often use one or more heatsinks to dissipate heat from power modules, such as those employed in electric vehicles. Improper assembly and/or installation of a cooling system may lead to scrapping or failure of the cooling system and/or power module. In addition to issues associated with cooling, electrical components including multiple power modules and/or systems incorporating these electrical components can be very complex, in both assembly process and ultimate post-assembly configurations. The present disclosure is directed to overcoming one or more of these above-referenced challenges.

SUMMARY OF THE DISCLOSURE

In some aspects, the techniques described herein relate to a base for an electrical component, the base including: a body, the body defining: a rim, pin slots, and first engagement slots; contact terminals; and electrical connectors, each of the electrical connectors being positioned within a respective pin slot and including a pin terminal positioned on a first surface of the body; wherein the base is configured to provide an electrical connection between one or more power modules and a substrate.

In some aspects, the techniques described herein relate to a base, wherein the first engagement slots are configured to receive prongs secured to the one or more power modules and secure the one or more power modules to the substrate.

In some aspects, the techniques described herein relate to a base, wherein the body further defines first and second apertures configured to receive first and second fittings of a heatsink.

In some aspects, the techniques described herein relate to a base, further including: fasteners configured to secure the base to the substrate, wherein the body defines apertures within the rim configured to receive the fasteners.

In some aspects, the techniques described herein relate to a base, wherein the body further defines second engagement slots, and wherein the first engagement slots are configured to receive first prongs and the second engagement slots are configured to receive second prongs different from the first prongs.

In some aspects, the techniques described herein relate to a base, wherein the base is configured to provide the electrical connection with one or more of the contact terminals or respective pin terminals of the electrical connectors.

In some aspects, the techniques described herein relate to a base, wherein one or more of the contact terminals is configured to be electrically connected to a terminal of the one or more power modules.

In some aspects, the techniques described herein relate to a base, wherein the pin terminals are configured to be electrically connected to signal pins of the one or more power modules.

In some aspects, the techniques described herein relate to a base, wherein each electrical connector includes a connection pin that extends from a respective pin terminal and is disposed in a pin slot corresponding to the electrical connector.

In some aspects, the techniques described herein relate to a base, wherein each pin slot is configured to receive a tab of a respective connection pin disposed in the pin slot, and wherein the tab is configured to limit movement of a respective electrical connector toward the first surface.

In some aspects, the techniques described herein relate to a base, wherein connection pins of the electrical connectors extend from respective pin slots through a second surface of the base.

In some aspects, the techniques described herein relate to a base, wherein the body defines protrusions extending from the first surface, and wherein the protrusions define pin grooves configured to receive respective pin terminals of the electrical connectors.

In some aspects, the techniques described herein relate to a base, wherein the body defines pin grooves on the first surface, and wherein each pin groove is configured to receive a pin terminal of an electrical connector and a signal pin of the one or more power modules.

In some aspects, the techniques described herein relate to an electrical component including: a cooling system; a plurality of power modules integrated into the cooling system; and a base including: a body defining a rim and a recessed wall surrounded by the rim, contact terminals, and electrical connectors including terminal and pin components, the electrical connectors extending through the rim; wherein the body accommodates a portion of the cooling system within the recessed wall and is configured to extend between the cooling system and a substrate, and wherein the base is configured to provide electrical connections between the plurality of power modules and the substrate.

In some aspects, the techniques described herein relate to an electrical component, wherein each electrical connector includes a pin terminal and a connection pin disposed in a pin slot, wherein each pin terminal is positioned on a first surface of the body facing the cooling system and each connection pin extends through a second surface of the body configured to face the substrate.

In some aspects, the techniques described herein relate to an electrical component, wherein each electrical connector includes a pin terminal positioned on a surface of the rim, wherein each contact terminal is positioned next to one or more electrical connectors, wherein signal pins of the plurality power modules are electrically connected to pin terminals of the electrical connectors, and wherein terminals of the plurality of power modules are electrically connected to the contact terminals of the base.

In some aspects, the techniques described herein relate to an electrical component, wherein the cooling system includes a first heatsink and a second heatsink, wherein the plurality of power modules are positioned between the first heatsink and the second heatsink.

In some aspects, the techniques described herein relate to an electrical component, wherein the cooling system includes one or more active cooling heatsinks.

In some aspects, the techniques described herein relate to an electrical component, wherein the body of the base further defines first and second apertures in the recessed wall, wherein the first aperture accommodates a first fluid connection to an inlet of the active cooling heatsink and the second aperture accommodates a second fluid connection to an outlet of the active cooling heatsink.

In some aspects, the techniques described herein relate to a subassembly for an electrical component including: a first heatsink; a second heatsink; a plurality of power modules positioned between the first heatsink and the second heatsink; and a base including: a body, the body defining: a rim, a recessed wall surrounded by the rim, pin slots, and first engagement slots; contact terminals; and electrical connectors including terminal and pin components, each of the electrical connectors being positioned within a respective pin slot and including a pin terminal positioned on a first surface of the body; wherein one or more of the contact terminals or the electrical connectors is configured to provide electrical connections between the plurality of power modules and a substrate, and wherein the first heatsink is positioned within the recessed wall of the base.

Additional objects and advantages of the disclosed embodiments will be set forth in part in the description that follows, and in part will be apparent from the description, or may be learned by practice of the disclosed embodiments. The objects and advantages of the disclosed embodiments will be realized and attained by means of the elements and combinations particularly pointed out in the appended claims.

It is to be understood that both the foregoing general description and the following detailed description are exemplary and explanatory only and are not restrictive of the disclosed embodiments, as claimed.

BRIEF DESCRIPTION OF THE DRAWINGS

The accompanying drawings, which are incorporated in and constitute a part of this specification, illustrate various exemplary embodiments and together with the description, serve to explain the principles of the disclosed embodiments.

FIGS. 5A-5C depict cross-sectional views of the exemplary power module assembly of FIG. 3A from planes respectively corresponding to lines 5A-5A, 5B-5B, and 5C-5C in FIG. 4A, according to one or more embodiments.

FIG. 5D depicts an enlarged view of a portion of FIG. 3A that includes one engagement between a power module and a base of the power module assembly of FIG. 3A, according to one or more embodiments.

FIG. 8A depicts an isometric view of an exemplary module and cooling system (MCS) subassembly, according to one or more embodiments.

FIG. 8B depicts an isometric view of an exemplary base for a power module assembly, according to one or more embodiments.

FIGS. 10A and 10B depict overhead and bottom views of the subassembly of FIG. 8B, according to one or more embodiments.

FIGS. 12-15 depict isometric views of different plates, according to one or more embodiments.

FIGS. 16A and 16B depict isometric and front elevation views of a plate, according to one more embodiments.

DETAILED DESCRIPTION OF EMBODIMENTS

Figure 1:
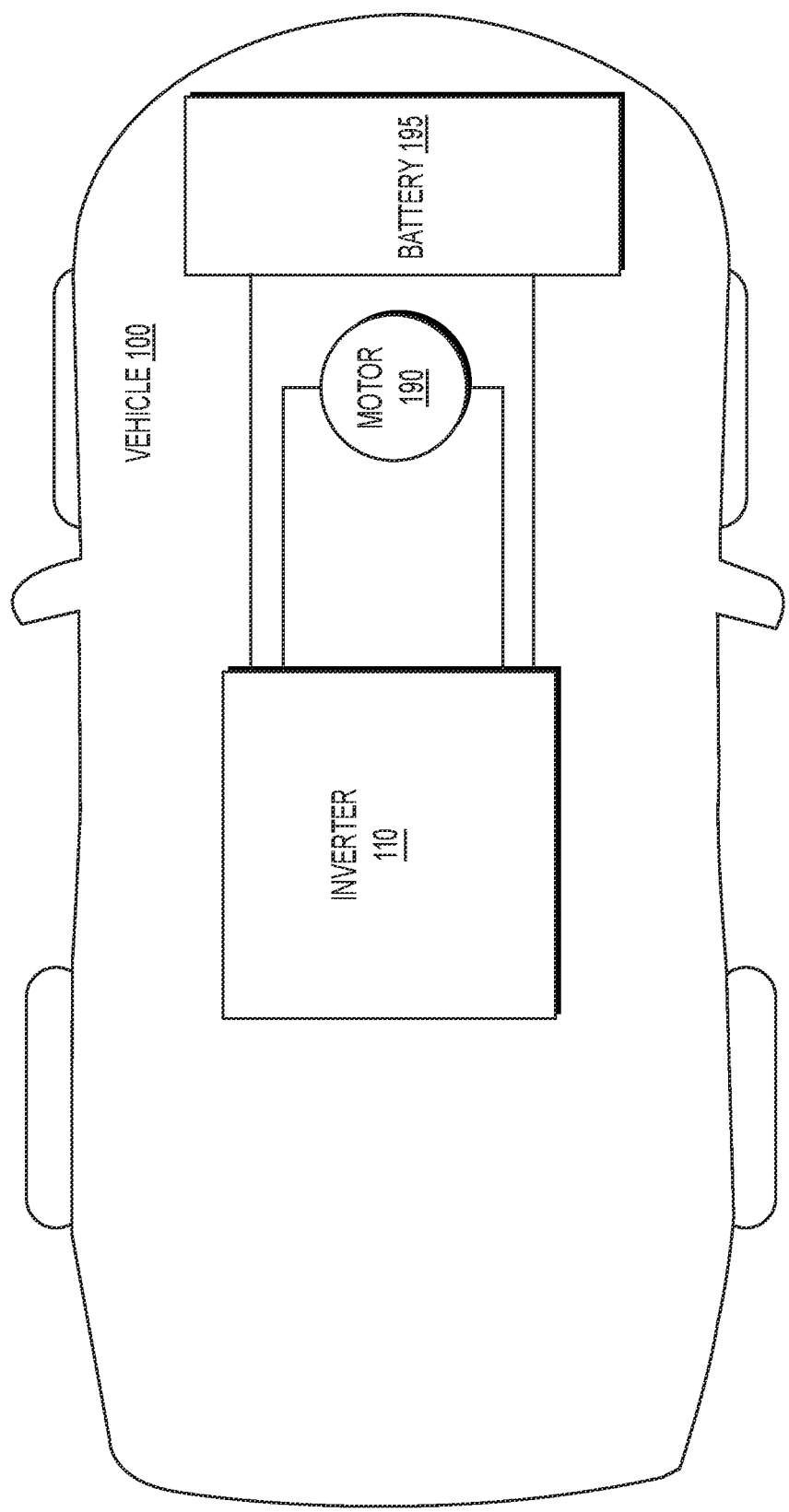
FIG. 1 depicts an exemplary system infrastructure for a vehicle including an inverter, according to one or more embodiments.

Both the foregoing general description and the following detailed description are exemplary and explanatory only and are not restrictive of the features, as claimed. As used herein, the terms "comprises," "comprising," "has," "having," "includes," "including," or other variations thereof, are intended to cover a non-exclusive inclusion such that a process, method, article, or apparatus that comprises a list of elements does not include only those elements, but may include other elements not expressly listed or inherent to such a process, method, article, or apparatus. In this disclosure, unless stated otherwise, relative terms, such as, for example, "about," "substantially," and "approximately" are used to indicate a possible variation of ±10% in the stated value. In this disclosure, unless stated otherwise, any numeric value may include a possible variation of ±10% in the stated value.

The terminology used below may be interpreted in its broadest reasonable manner, even though it is being used in conjunction with a detailed description of certain specific examples of the present disclosure. Indeed, certain terms may even be emphasized below; however, any terminology intended to be interpreted in any restricted manner will be overtly and specifically defined as such in this Detailed Description section. For example, in the context of the disclosure, the switching devices may be described as switches or devices, but may refer to any device for controlling the flow of power in an electrical circuit. For example, switches may be metal-oxide-semiconductor field-effect transistors (MOSFETs), bipolar junction transistors (BJTs), insulated-gate bipolar transistors (IGBTs), or relays, for example, or any combination thereof, but are not limited thereto.

Various embodiments of the present disclosure relate generally to systems and methods for testing and securing electrical components, and, more particularly, to systems and methods for: (1) testing power modules for a power module assembly, such as a power module assembly that may be incorporated in an inverter for an electric vehicle; and (2) securing the power module assembly to another electrical component, such as a substrate incorporated into an inverter for an electric vehicle.

Inverters, such as those used to drive a motor in an electric vehicle, for example, are responsible for converting High Voltage Direct Current (HVDC) into Alternating Current (AC) to drive the motor. A three phase inverter may include a bridge with six power device switches (for example, power transistors such as IGBT or MOSFET) that are controlled by Pulse Width Modulation (PWM) signals generated by a controller. An inverter may include three half-H bridge switches to control the phase voltage, upper and lower gate drivers to control the switches, a PWM controller, and glue logic between the PWM controller and the gate drivers. The PWM controller may generate signals to define the intended states of the system. The gate drivers may send the signals from the PWM controller to the half-H bridge switches. The half-H bridge switches may drive the phase voltage. The inverter may include an isolation barrier between low voltage and high voltage planes. Signals may pass from the PWM controller to the half-H bridge switches by passing across the isolation barrier, which may employ optical, transformer-based, or capacitance-based isolation. PWM signals may be distorted when passing through the glue logic, which may include resistive, capacitive, or other types of filtering. PWM signals may be distorted when passing through the gate driver, due to the galvanic isolation barrier and other delays within the gate driver. PWM signals may be distorted when the signals processed by the half-H switch via the gate driver output.

Gate drivers may tolerate common-mode transients that occur during field-effect transistor (FET) switching and when one side of the floating high voltage terminal is shorted to ground or subject to an electro-static discharge. These voltage transients may result in fast edges, which may create bursts of common-mode current through the galvanic isolation. A gate driver may need to demonstrate common-mode transient immunity (CMTI) in order to be effective and safe.

Gate drivers may have a high-voltage domain in common to the voltage plane of an associated FET. Further, high-voltage planes may be supplied by a flyback converter that may be isolated through a transformer from the low-voltage plane. The high-voltage domain supply may be used to power circuits which source and sink gate current to drive the FET and which may detect FET faults so the faults can be acted upon and/or communicated to the low-voltage domain. Gate drivers may include a galvanic channel dedicated to FET commands, and one or more bidirectional or unidirectional galvanic channels dedicated to FET communications.

High current switching transients may create strong electro-magnetic (EM) fields that may couple into nearby metal traces. The magnitude and frequency of coupled currents may depend upon the layout of the FET packaging solution and the direction and length of metal traces between the FET and the control integrated circuit (IC). For example, typical values for coupled currents may be up to 1A at AC frequencies up to 100 MHz. Typically, within a circuit, the gate driver IC may be placed far enough away from the FET that high EM fields do not couple directly into the internal metal traces within the gate driver IC. The gate driver is placed a distance from EM fields such that induced currents within the circuitry are below levels that will cause malfunction of the gate driver, or a metal shield is placed between the gate driver and the source of EM fields to protect the gate driver circuitry. The output terminals of the gate driver that connect to the FET are exposed to the EM fields at the point where the output terminals are no longer covered by a shield. The gate driver switches large currents (such as 5A to 15A, for example) through these exposed terminals. The switched large currents are generally greater in magnitude than the EM-induced currents. The gate driver is able to overdrive the induced currents to maintain control of the FETs. The high side of the gate drivers and the FET may share a common ground and a gate control signal trace, both of which may be susceptible to coupled currents.

Gate drivers may turn on low-resistance switches to source and sink gate currents. Series resistors may sometimes be added to limit gate current. Switched gate currents may be larger than coupled currents in order to maintain control of their respective FETs.

Gate drivers may be able to sense FET operating voltages or currents in order to provide feedback and react to faults. Over-current faults may typically be detected by sensing the FET drain to source voltage and comparing the sensed voltage to a reference value. Sensed voltages may be heavily filtered to reject coupled currents. Filtering may slow down the response to fault conditions, resulting in delays in response. For example, the rate of current increase due to a low resistance short circuit may reach damaging levels prior to being detected by the heavily filtered drain to source voltage detection strategy. The resulting short circuit may damage the FET or the vehicle, prior to being detected and shut off.

According to one or more embodiments, a FET driver circuit may provide rapid over-current detection by either shunt current sensing or by diverting a fraction of the load current through a parallel FET that may have a current sensing circuit. Utilizing either strategy may require a "point-of-use IC" where sensing circuitry is in close proximity to the FET. Even if a point-of-use IC and a remote controller are resistant to EM fields, communication between the point-of-use IC and remote controller remains susceptible to induced currents. Point-of-use ICs have been implemented in low EM field applications, such as smart FETs for automotive applications. However, point-of-use ICs have not been used in high EM field applications. A high EM field may be a field (i) that induces a current within an IC that is in excess of an operating current of the IC and leads to malfunction, or (ii) that induces a differential voltage within an IC which is in excess of the operating differential voltage and leads to malfunction. A high EM field may be a field that is greater than approximately 10A or approximately 100V, for example.

A power module assembly for an inverter, such as those discussed above, may incorporate a cooling system that may include two active heatsinks on either side (e.g., opposing top and bottom sides) of one or more electrical components, such as power modules. An active heatsink may be a heatsink having components (e.g., fins or compartments) through which a coolant material flows. For simplicity, this disclosure references electrical components as power modules, substrates, printed circuit boards (PCBs), and combinations thereof, though it will be understood that the techniques disclosed herein may apply to any electrical component (e.g., power switches, chips, chip components, controllers, etc.) that may generate heat. According to one or more embodiments, a power module assembly may include two active heatsinks. These heatsinks may provide thermal dissipation by drawing heat away from one or more dies, also referred to as power switches, towards a surface area of a power module, and further towards portions of the active heatsink that make direct or indirect contact with a cooling medium, e.g., coolant or air, associated with the active heatsinks.

Heatsinks may provide effective means of dissipating heat by thermally conducting heat into a fluid medium, often via a utilization of Thermal Interface Material (TIM). Automotive cooling systems, for example, often use one or more heatsinks to dissipate heat from power modules, such as those employed in electric vehicles. Even though system performance needs requiring lower thermal resistance continue to rise, such as the needs in the electric vehicle industry, performance capabilities of various electrical components, such as power modules generally, power modules for inverters, and inverters generally, remain limited by cooling capabilities of conventional heat dissipation components. In addition to the issues related to cooling, securing in place heat dissipation components, such as active heatsinks, may be complex, and current solutions provide poor force distribution onto electrical components.

In some electrical components that include multiple power modules, clamps may be used to provide pressure that compresses TIM over the respective lifetimes of these components. However, these configurations of clamps do not adequately account for design complexity, material expenses, and risk of coolant leaks involved in heatsink use. In particular, the use of such clamps, which may be complex in configuration and implementation, can provide unequal loading at sealing areas where coolant passes from one heatsink to another. Such problems risk rendering the types of electrical components with multiple power modules, and those components electrically connected thereto, inoperable or sub-operable due to such issues or resultant electrical component damage.

In addition to issues associated with cooling, electrical components including multiple power modules and/or systems incorporating these electrical components can be very complex, in both assembly process and ultimate post-assembly configurations. There may be a high cost to scrap a component including multiple power modules. Processes aim at mitigating having to scrap such electrical components or system that include the components may require significant testing prior to operation. However, a method of testing an assembly of multiple power modules prior to incorporation or installation into a system, or even a portion thereof, such as substrate (e.g., a printed circuit board (PCB)), has not been developed. More specifically, known designs of electrical components including multiple power modules do not support testing the multiple power modules together as an assembly, and tend to drive high cost by requiring extra die cast and/or extra assembly processes. For example, in some electrical components including multiple power modules and clamps as previously described, portions of the clamps may plastically deform heatsink "tabs" during assembly or handling. In turn, this can cause reduced applications of force on various sub-components (e.g., heatsinks, power modules), reduced thermal performance, and less than optimal overall operation.

Other assembly processes for electrical components including multiple power modules may involve a lead-form of signal pins that may then be located and soldered to a PCB. A total pin count for such a process may be relatively high. Differences in lead length and flexibility among the signal pins yields high degree of variance in what is required to locate and solder each signal pin during assembly. Furthermore, because locating signal pins to a PCB is often performed manually and leads for the signal pins are easily deformed, scrap rates for these high value components may be substantial.

As a result, a need exists for power module assembly components that enable sub-processes for assembling, testing, and securing a power module assembly to another electrical component (such as a substrate incorporated in an electric vehicle) to be comingled and performed in such a manner that reduces scrap rates associated with overall validation and installation processes of these types of electrical components and systems.

It may be desirable to improve cooling system function in a power module assembly, e.g., by using combinations of plates that evenly apply compressive forces to the heatsinks. In turn, a tightly held assembly between the heatsinks and power modules may be maintained, and the active heatsinks may be reliably secured to each other and a base that may be connected to a substrate. The substrate, in one example, may facilitate operations of other electrical components, such as a motor in an electric vehicle, based on an electrical connection to the power modules as the power modules convert HVDC into AC and vice versa. The application of an evenly distributed force on one or both active heatsinks may reduce thermal resistance between the power modules and the active heatsinks. This, in turn, may facilitate greater amounts of heat dissipation and improved cooling of the power modules, and potentially improve operational performance and/or prolong operating lives of the power modules (or power module assembly as a whole).

Thus, according to an aspect of the present disclosure, exemplary plate systems described herein provide a solution that involves uniformly applying a force to heatsinks of a power module assembly within an axis of thermal heat transfer. More specifically, exemplary configurations of first and second plates incorporated in power module assemblies described herein, provide low-complexity, modular structures configured to apply substantially uniform distributed forces on heatsinks included in respective power module assemblies. As a result, these heatsinks may compress evenly against power modules, which in turn results in a low thermal resistance and even distribution of thermal interface material (TIM) there-between. The reduced thermal resistance may result in improved cooling of the power modules during operation. Furthermore, even distribution of TIM between the heatsinks and power modules may minimize opportunities for hot spots to develop between these components, which could otherwise result from less TIM persisting in some areas relative to other areas.

According to an aspect of the present disclosure, power module assemblies may require series of testing before being put into service in, for example, an electric vehicle. According to an aspect of the present disclosure, a power module assembly may include a base subassembly that is installed between power modules (and leads of respective signal pins of the power modules) and a substrate, such as a PCB. More specifically, the base, as a subassembly of the power module assembly, may be installed between the power modules and the PCB with separate soldered terminals or compliant pins that engage (e.g., insert into) the PCB. With such a base installed, the signal pins of the power modules may be laser welded to terminals of the base to create an electrical connection with the PCB. This approach allows for testing (sub) assemblies of multiple power modules before or after welding, and may greatly improve manufacturing assembly processes from success rate, time, and material cost standpoints.

FIG. 1 depicts an exemplary system infrastructure for a vehicle including an inverter, according to one or more embodiments. As shown in FIG. 1, electric vehicle 100 may include an inverter 110, a motor 190, and a battery 195. The inverter 110 may include components to receive electrical power from an external source and output electrical power to charge battery 195 of electric vehicle 100. The inverter 110 may convert DC power from battery 195 in electric vehicle 100 to AC power, to drive motor 190 of the electric vehicle 100, for example, but the embodiments are not limited thereto. The inverter 110 may be bidirectional, and may convert DC power to AC power, or convert AC power to DC power, such as during regenerative braking, for example. Inverter 110 may be a three-phase inverter, a single-phase inverter, or a multi-phase inverter.

Figure 2:
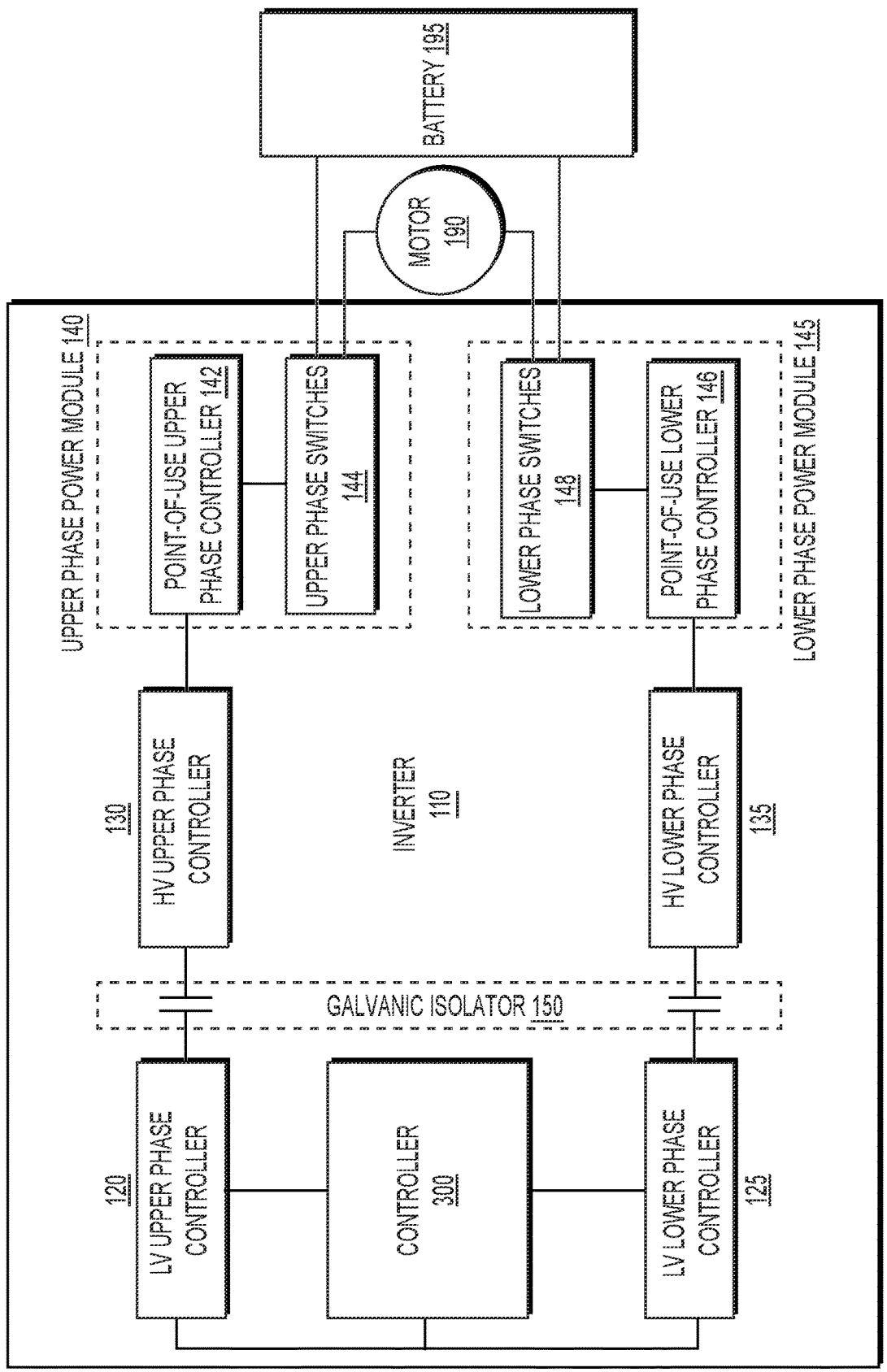
FIG. 2 depicts an exemplary system infrastructure for the inverter of FIG. 1 with a point-of-use switch controller, according to one or more embodiments.

FIG. 2 depicts an exemplary system infrastructure for the inverter 110 of FIG. 1 with a point-of-use switch controller, according to one or more embodiments. Electric vehicle 100 may include inverter 110, motor 190, and battery 195. Inverter 110 may include an inverter controller 300 to control the inverter 110. Inverter 110 may include a low voltage upper phase controller 120 separated from a high voltage upper phase controller 130 by a galvanic isolator 150, and an upper phase power module 140. Upper phase power module 140 may include a point-of-use upper phase controller 142 and upper phase switches 144. Inverter 110 may include a low voltage lower phase controller 125 separated from a high voltage lower phase controller 135 by galvanic isolator 150, and a lower phase power module 145. Lower phase power module 145 may include a point-of-use lower phase controller 146 and lower phase switches 148. Upper phase switches 144 and lower phase switches 148 may be connected to motor 190 and battery 195. Galvanic isolator 150 may be one or more of optical, transformer-based, or capacitance-based isolation. Galvanic isolator 150 may be one or more capacitors with a value from approximately 20 fF to approximately 100 fF, with a breakdown voltage from approximately 6 kV to approximately 12 kV, for example. Galvanic isolator 150 may include a pair of capacitors, where one capacitor of the pair carries an inverse data signal from the other capacitor of the pair to create a differential signal for common-mode noise rejection. Galvanic isolator 150 may include more than one capacitor in series. Galvanic isolator 150 may include one capacitor located on a first IC, or may include a first capacitor located on a first IC and a second capacitor located on a second IC that communicates with the first IC.

Inverter 110 may include a low voltage area, where voltages are generally less than 5V, for example, and a high voltage area, where voltages may exceed 500V, for example. The low voltage area may be separated from the high voltage area by galvanic isolator 150. Inverter controller 300 may be in the low voltage area of inverter 110, and may send signals to and receive signals from low voltage upper phase controller 120. Low voltage upper phase controller 120 may be in the low voltage area of inverter 110, and may send signals to and receive signals from high voltage upper phase controller 130. Low voltage upper phase controller 120 may send signals to and receive signals from low voltage lower phase controller 125. High voltage upper phase controller 130 may be in the high voltage area of inverter 110. Accordingly, signals between low voltage upper phase controller 120 and high voltage upper phase controller 130 pass through galvanic isolator 150. High voltage upper phase controller 130 may send signals to and receive signals from point-of-use upper phase controller 142 in upper phase power module 140. Point-of-use upper phase controller 142 may send signals to and receive signals from upper phase switches 144. Upper phase switches 144 may be connected to motor 190 and battery 195. Upper phase switches 144 and lower phase switches 148 may be used to transfer energy from motor 190 to battery 195, from battery 195 to motor 190, from an external source to battery 195, or from battery 195 to an external source, for example. The lower phase system of inverter 110 may be similar to the upper phase system as described above.

Figure 3A:
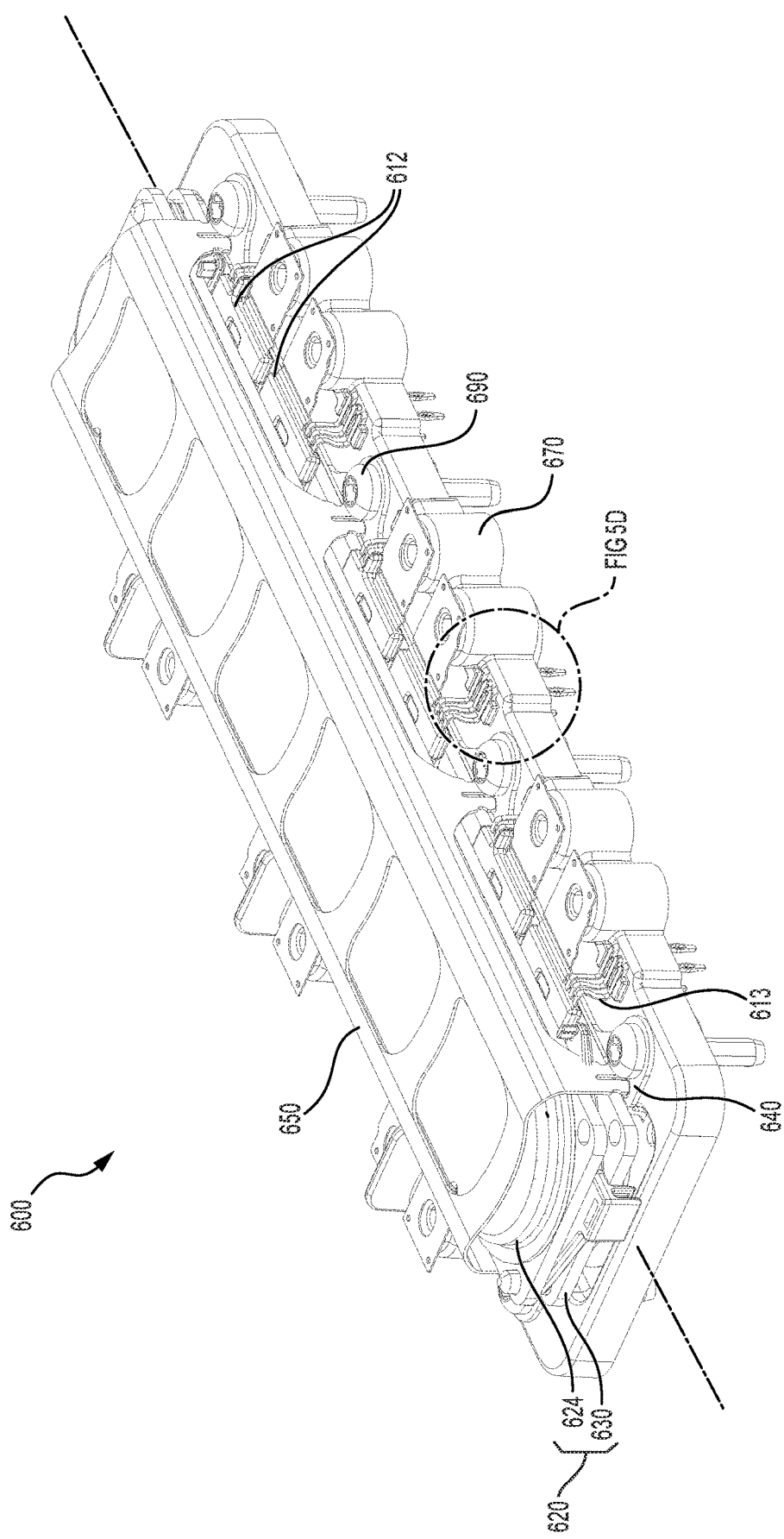
FIG. 3A depicts an isometric view of an exemplary power module assembly, according to one or more embodiments.

FIG. 3A depicts an isometric view of an exemplary power module assembly 600, according to one or more embodiments. The power module assembly 600 may include power modules 612 that are integrated into an exemplary cooling system 620. The cooling system 620 may include first and second heatsinks 624, 630 held in positions relative to the power modules 612 (e.g., above and below, or otherwise on opposing sides of the power modules 612) by first and second plates 640, 650. As shown, the first and second plates 640, 650 may be configured to attach the power modules 612 and the cooling system 620 to a base 670. The first and second plates 640, 650 may secure the power modules 612 to the base 670 in such a way that signal pins 613 of the power modules 612, which provide electrical leads and extend outside of the cooling system 620, may be connected to signal pin terminals installed in the base 670, and thereby provide an electrical connection between the power modules 612 and the base 670.

The exemplary configuration of the first and second plates 640, 650 in the power module assembly 600 provides a low-complexity, modular structure that defines a frame that may effectively house the power modules 612 and the first and second heatsinks 624, 630. Furthermore, the first and second plates 640, 650 provide a modular structure that can apply a substantially uniform distributed force on the first and second heatsinks 624, 630, and in particular along a longitudinal axis of the power module assembly 600. The first and second heatsinks 624, 630 may compress against power modules 612 evenly, which in turn results in a low thermal resistance there-between. Thus, the first and second plates 640, 650 uniformly apply a force to the first and second heatsinks 624, 630 within an axis or plane of thermal heat transfer (i.e., an axis or plane perpendicular to the longitudinal axis of the power module assembly 600).

One of ordinary skill in the art will recognize the cooling system 620 depicted in FIG. 3A including two active cooling heatsinks is an exemplary cooling system. According to the present disclosure, a cooling system that may be incorporated into the exemplary power module assemblies described herein may include one heatsink, two heatsinks, may employ one-sided active or passive cooling, double-sided active cooling, double-sided passive cooling, or double-sided cooling provided by one active cooling component and one passive cooling component.

Figure 3B:
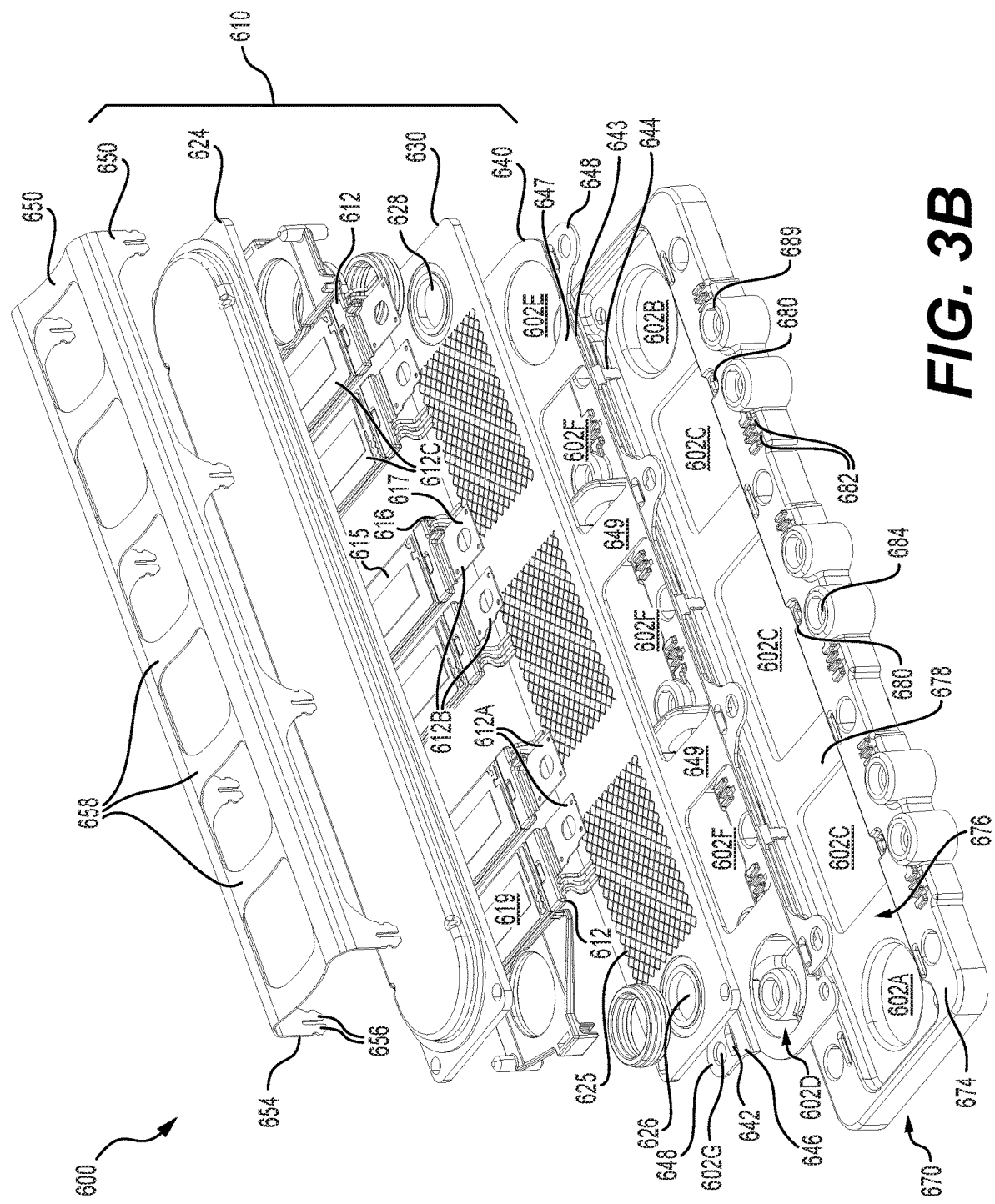
FIG. 3B depicts an exploded view of the exemplary power module assembly of FIG. 3A, according to one or more embodiments.

FIG. 3B depicts an exploded view of the exemplary power module assembly 600 of FIG. 3A. The base 670 includes a body 672 that defines an outer rim 674 that surrounds a recessed wall 676 that defines first and second apertures 602A, 602B in opposite ends of the body 672 of the base 670. Along a longitudinal axis of the base 670, the recessed wall 676 includes first ribs 678 that define third apertures 602C between the first and second apertures 602A, 602B.

As shown in FIG. 3B, the body 672 of the base 670 may also: (1) define pin slots 682 within the outer rim 674; and (2) have integrated therein, raised edges 689 disposed above the bores 684 defined by the body 672. The pin slots 682 may facilitate electrical connection between the power module assembly 600 and another electrical component, such as a substrate incorporated in an electric vehicle. In one embodiment, each pin slot 682 may receive one or more electrical connectors 830 that includes one or more vertically extending connection pins 835 and a horizontally extending signal pin terminal 850 as shown in FIGS. 5A and 8B. In one example, each connection pin 835 may be configured to extend from a bottom surface 805 of the base 670, as shown in FIGS. 4B-5C, and be inserted into another electrical component (e.g., a substrate, inverter, inverter housing) incorporated in an electric vehicle.

The base 670 may be disposed between signal pins 613 of the power modules 612 and a substrate (e.g., a PCB). Furthermore, the base 670 may be connected to the substrate via vertically extending connection pins 835, which may be constituted with compliant pins that may be attached to the substrate. In an embodiment, the base 670 may include separate soldered terminals for connecting to the substrate. Connections between the base 670 and the power modules 612 may be provided through laser welding the signal pins 613 of the power modules 612 to respective signal pin terminals 850 (set FIGS. 5A and 8B) installed in the base 670.

Accordingly, with the incorporation of the base 670, the signal pins 613 for the power modules may not be soldered directly to a substrate. In one embodiment, the signal pins 613 are not soldered directly to a substrate. As described in more detail with reference to FIG. 8A, the configuration provided with the base 670 allows for modular testing before or after welding, and may greatly improve manufacturing assembly processes such that fewer power module assemblies are lost or scrapped due to welding and other assembly issues.

On each side of the first plate 640 extending along a longitudinal axis thereof, first prongs 644 extend downward towards the base 670 from a lip 643 of the first plate 640. Each lip 643 extends outwardly from a top of a respective stepped wall 646 and defines an edge along the longitudinal axis from which flange elements 648 also extend outwardly relative to a respective stepped wall 646. A wall 647 extends between the stepped walls 646 and defines fourth and fifth apertures 602D, 602E on opposite ends of the first plate 640. In one embodiment, the body 672 of the base 670 defines a plurality of the first engagement slots 680 configured to engage and retain the first prongs 644 that extend from the first plate 640. Together, the first prongs 644 of the first plate 640 and the first engagement slots 680 of the base 670 define a first inter-subassembly connection between the base 670 and a module and cooling system subassembly 610 ("MCS 610"), which includes the first plate 640 and is discussed in more detail below with reference to FIG. 3C.

Similar to the recessed wall 676 of the base 670, the wall 647 of the first plate 640 defines sixth apertures 602F defined by second ribs 649. The second ribs 649 and the fourth through sixth apertures 602D, 602E, 602F respectively correspond to the first ribs 678 and the first through third apertures 602A, 602B, 602C of the base 670. In addition, the stepped walls 646 may correspond to side walls of the recessed wall 676 of the base 670 such that the first plate 640 may fit into the recessed wall 676. Furthermore, seventh apertures 602G within the flange elements 648 of the first plate 640 may correspond with bores 684 formed in the base 670. As shown in FIG. 3A, each combination of a seventh aperture 602G and a bore 684 may receive a fastener 690 that secures/attaches the first plate 640 to the base 670.

Figure 3C:
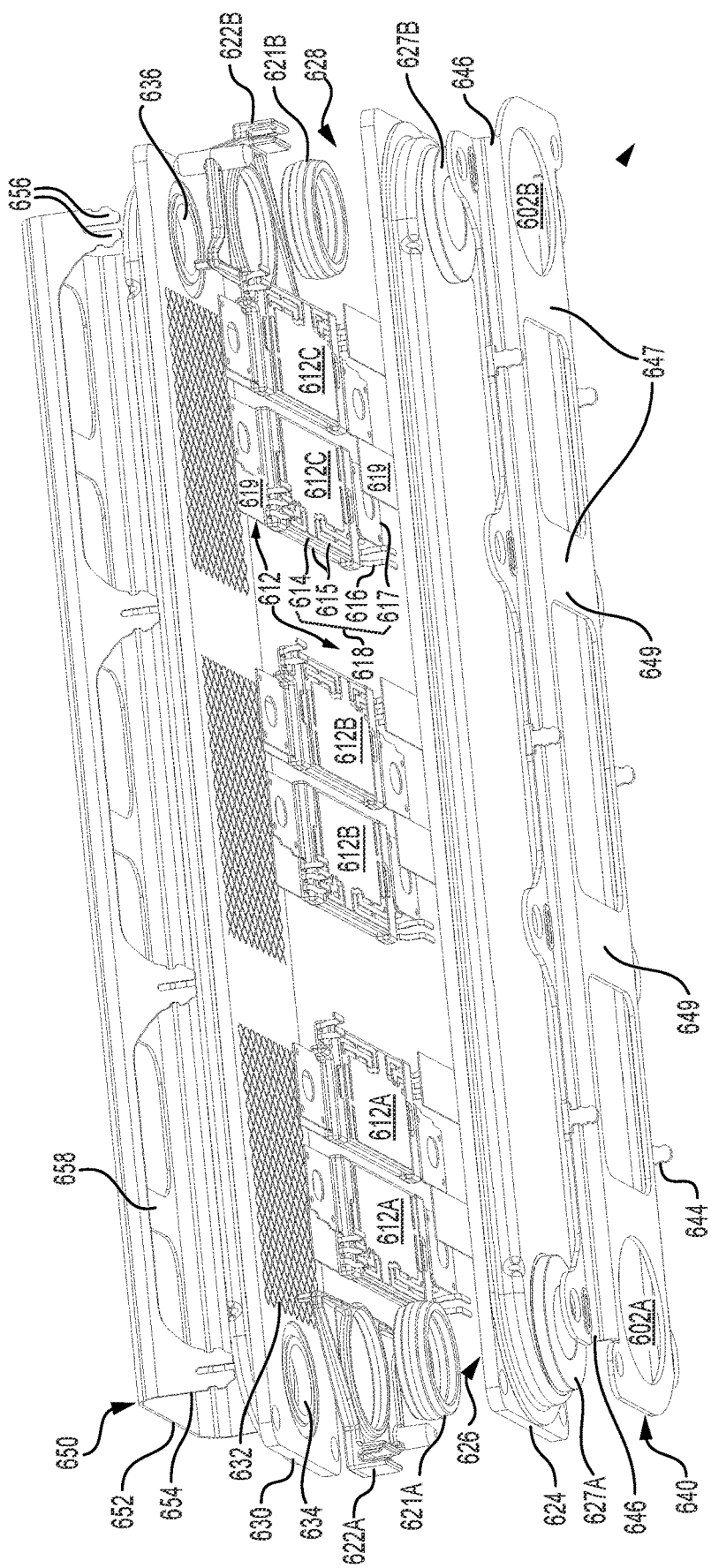
FIG. 3C depicts a bottom exploded view of a module and cooling system (MCS) subassembly of the exemplary power module assembly of FIGS. 3A and 3B, according to one or more embodiments.

FIG. 3C depicts a bottom exploded view of a module and cooling system subassembly 610 of the exemplary power module assembly 600 of FIGS. 3A and 3B. In one embodiment, the first and second apertures 602A, 602B respectively define access to a cooling system inlet and outlet. In particular, the first aperture 602A may be configured to accommodate fluid communication between a first port 626 of the first heatsink 624 of the cooling system 620 and one coolant (or other fluid) carrying conduit (not shown). Accordingly, the first aperture 602A may facilitate a flow of coolant (or other fluid) into the cooling system 620 of the power module assembly 600. The flow of coolant may be provided through a connection between the one conduit and a first fitting 627A disposed on an underside of the first heatsink 624.

Similar to the first aperture 602A, the second aperture 602B may be configured to accommodate fluid communication between a second port 628 of the first heatsink 624 of the cooling system 620 and another coolant (or other fluid) carrying conduit (not shown). Accordingly, the second aperture 602B may facilitate a flow of coolant (or other fluid) from the cooling system 620 of the power module assembly 600. In one example, this may be provided through a connection between the other conduit and a second fitting 627B disposed on an underside of the first heatsink 624. The first and second apertures 602A, 602B may be configured to receive the first and second fittings 627A, 627B.

As depicted in FIG. 3C, the first and second heatsinks 624, 630 and integrated power modules 612 are positioned between the first plate 640 and the second plate 650. As noted above, the first heatsink 624 and the second heatsink 630 are part of the cooling system 620 identified in FIG. 6A. In addition, the cooling system 620 includes a first gasket 621A and a first support 622A positioned between the first and second heatsinks 624, 630 on an end of the power module assembly 600 corresponding to the cooling system inlet defined by the first aperture 602A of the base 670. Likewise, a second gasket 621B and a second support 622B are positioned between the first and second heatsinks 624, 630 on an end of the power module assembly 600 corresponding to the cooling system outlet defined by the second aperture 602B of the base 670. As shown in FIG. 3B, the first heatsink 624 includes a first contact interface 625 positioned below the power modules 612. Turning to FIG. 3C, the second heatsink 630 includes a second contact interface 632 positioned above the power modules 612.

FIG. 3C (as well as FIG. 3B) depicts the positions of three pairs of power modules 612 relative to the components of the cooling system 620. Each power module 612 may include a module subassembly 618 defined by combination of a substrate 614 and lead frames 615 disposed on opposite sides of the substrate 614. In one example, dies and various metallization and ceramic layers may be incorporated between the substrate 614 and the lead frames 615 of each module subassembly 618. In one embodiment, the dies may include silicon carbide (SiC)-based dies that deliver relatively high power densities and efficiencies needed to, for example, extend battery range and performance in, for example, an electric vehicle. Signal pins 613 and module terminals 617 extend from each module subassembly 618, outwardly relative to a longitudinal axis of the power module assembly 600. Each power module 612 may include one or more module terminals 617. Furthermore, each power module 612 may include metallization layers (e.g., copper layers) positioned above and below a respective module subassembly 618.

Each pair of power modules 612 positioned between the first and second supports 622A, 622B along the longitudinal axis provides a phase power module 612, such as the upper phase power module 140 or the lower phase power module 145 depicted in FIG. 2 and discussed above. Thus, the power module assembly 600 depicted in FIGS. 3A, 3B, and 3C includes first, second, and third phase power modules 612A, 612B, 612C that must be effectively cooled by the cooling system 620 in order to continuously operate as part of, for example, an inverter that may be included in, for example, an electric vehicle.

The first and second heatsinks 624, 630 of the cooling system 620 provide active cooling on top and bottom sides of the power modules 612. That is, coolant may pass from the first end of the power module assembly 600 to the second end through both of the first and second heatsinks 624, 630. As shown in FIGS. 3B and 3C, at least the first port 626 of the first heatsink 624, the first gasket 621A, the first support 622A, and a first port 634 of the second heatsink 630 define an inlet flow path for the cooling system 620. On the other hand, at least a second port 636 of the second heatsink 630, the second support 622B, the second gasket 621B, and the second port 628 of the first heatsink 624 define an outlet flow path for the cooling system 620.

The first port 626 of the first heatsink 624 serves as both: (1) an inlet for coolant to enter and flow longitudinally through the first heatsink 624, and (2) an outlet or first through port for coolant flowing vertically through the first heatsink 624 and on to the second heatsink 630. Similarly, the second port 628 of the first heatsink 624 provides both (1) an outlet for coolant flowing longitudinally through the first heatsink 624, and (2) an inlet or second through port for coolant from the second port 636 of the second heatsink 630. The coolant flows from the second heatsink 630 having traversed through a plurality of channels extending within the second heatsink 630 along a longitudinal axis of the power module assembly 600.

As shown in FIGS. 3B and 3C, the second plate 650 is positioned above the second heatsink 630. The second plate 650 may include a plate wall 652 that extends along the longitudinal axis of the power module assembly 600, and a series of legs 654 extending downwardly from each side of the plate wall 652 at substantially right angles relative to a plane corresponding to the plate wall 652. Each of the legs 654 may include a second prong 656 at an end of the leg 654.

Each second prong 656 may include two spring halves configured to be received by and secure the second plate 650 to a corresponding second engagement slot 642 provided in the first plate 640.

Advantages of the combination of the first and second plates 640, 650 will now be discussed in more detail with respect to design considerations that accompany the use of a double-sided active cooling system, and providing Thermal Interface Material (TIM) between first and second contact interfaces 625, 632. However, one of ordinary skill in the art will recognize that the first and second plates 640, 650 could be used in implementations that include multiple power module assemblies and: (1) double-sided cooling using passive and active cooling components (e.g., first passive heatsink includes fins exposed to an ambient environment and a second active heatsink includes channels through which coolant flows); (2) one-sided active cooling; (3) one-sided passive cooling; and (4) double-sided passive cooling.

Figure 7B:
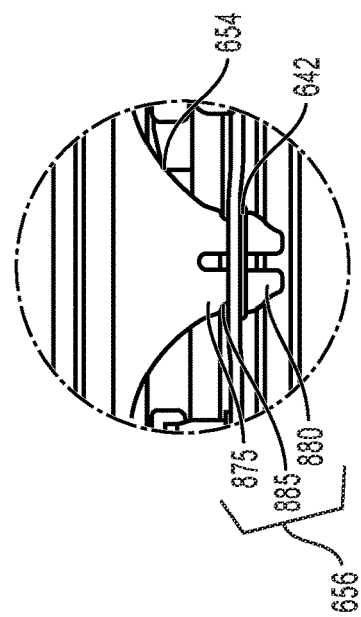
FIG. 7B depicts a close up of one engagement between first and second plates of the power module assembly of FIG. 3A, corresponding to a state of first and second plates depicted in FIG. 7A, according to one or more embodiments.
Figure 7A:
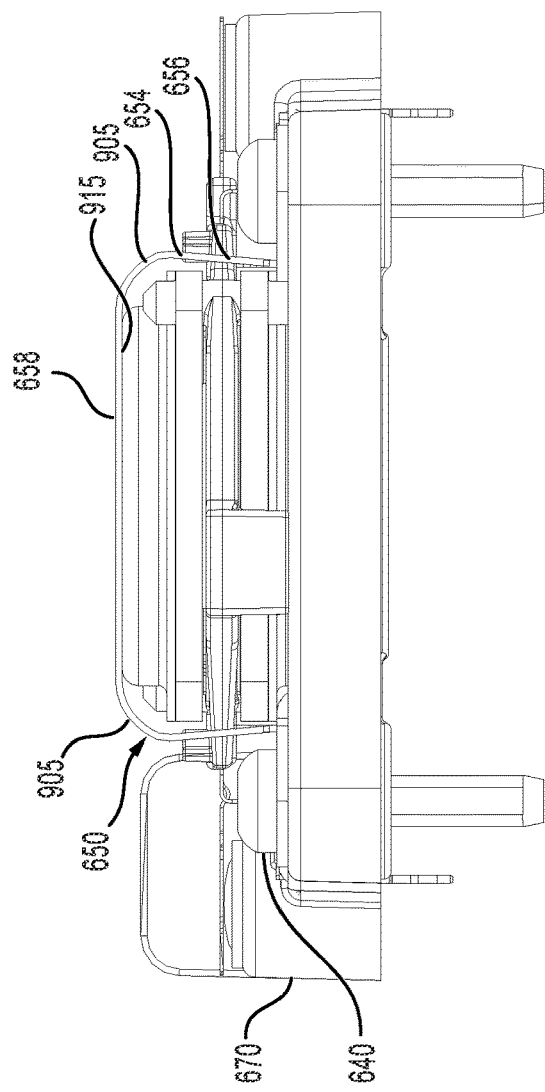
FIG. 7A depicts a front elevation view of an end of the power module assembly of FIG. 3A subsequent to a second plate being pressed, according to one or more embodiments.

In practice, as shown in FIGS. 7A and 7B, the first and second plates 640, 650 may provide a snapping feature at each second engagement slot 642 which engages/is engaged by two spring halves of a second prong 656, locking the second prong 656 in place. Thus, the first and second plates 640, 650 may provide a two-piece snapping system that provides a distributed clamp load to both sides of the cooling system 620, and thus to the power modules 612 of the power module assembly 600. In addition, the construction of each plate and interaction between the second engagement slots 642 of the first plate and the second prongs 656 of the second plate 650 provides a design that allows for modular assembly and testing of a subassembly that includes all of the power modules 612.

The combination of the first and second plates 640, 650 distribute force uniformly along the longitudinal axis of the power module assembly 600 where pressure is most critical. More specifically, once a force is applied to the second plate 650 such that the second prongs 656 of the second plate 650 engage and are secured to the second engagement slots 642 of the first plate 640, the second plate 650 may be placed in tension relative to the first plate 640 and apply a force on the second heatsink 630. As a result, the plate wall 652 of the second plate 650 applies pressure to an upper surface of the second heatsink 630. A distribution of the force applied by the second plate 650 to the second heatsink 630 is substantially uniform along a respective length and width thereof due to the configuration (e.g., arrangement, spacing, size, etc.) of the third ribs 658 provided with the second plate 650. As a further result of the uniform distribution of force by the second plate 650 on the second heatsink 630, a force applied by the second heatsink 630 on the power modules 612 and TIM disposed between the first and second heatsinks 624, 630 is also substantially uniform.

In addition to the advantages discussed above with respect to force distribution, the plate system including the first and second plates 640, 650 provides a vibration robustness as the plate system mounts directly to the base 670. The first and second heatsinks 624, 630 are also electrically grounded via the first and second plates 604, 650. This is a result of the direct contact: (1) between a surface of a housing of the first heatsink 624 and the recessed wall 676 of the first plate 640; and (2) between the surface of a housing of the second heatsink 630 and at least the third ribs 658 of the plate wall 652 of the second plate 650. The combination of the first and second plates 640, 650 also allow for sintering or soldering of the dies 619 of the power modules 612 to either of the first and second heatsinks 624, 630.

Figure 4A:
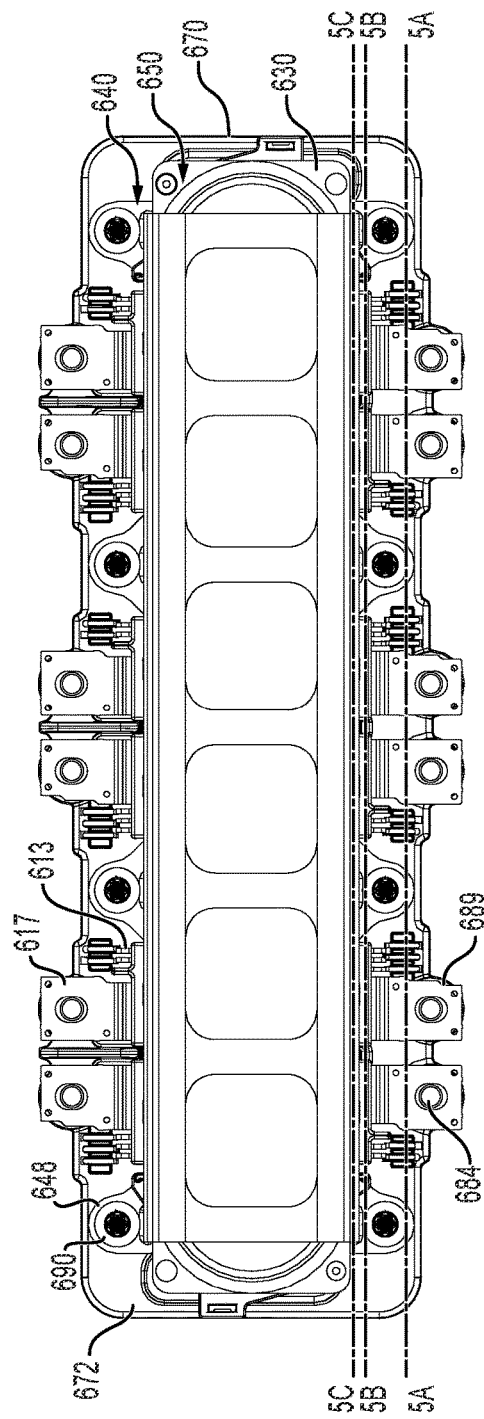
FIGS. 4A and 4B depict overhead and side elevation views of the exemplary power module assembly of FIG. 3A, according to one or more embodiments.
Figure 4B:
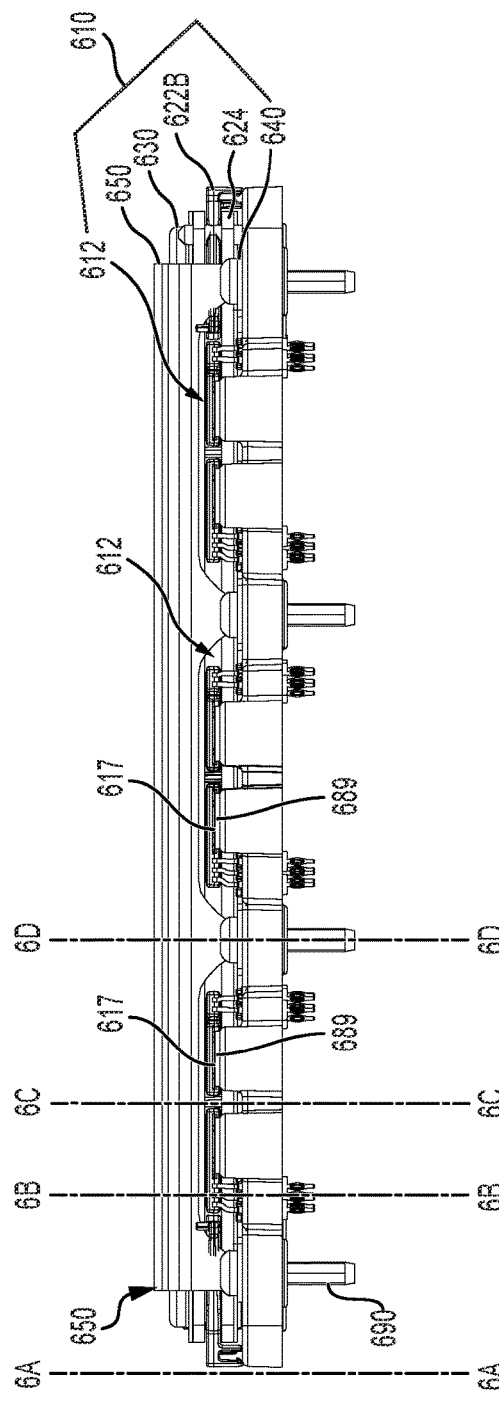

FIGS. 4A and 4B depict overhead and side elevation views of the exemplary power module assembly 600 of FIG. 3A. As noted above, the first prongs 644 of the first plate 640 and the first engagement slots 680 of the base 670 depicted in FIGS. 3B and 3C define a first inter-subassembly connection between the base 670 and the MCS 610. FIGS. 4A and 4B depict second, third, and fourth inter-subassembly connections between the base 670 and the MCS 610.

More specifically, a second connection is defined by a physical connection between the MCS 610 and the base 670 provided with: (1) the alignment of (a) seventh apertures 602G (see FIG. 3B) defined by the flange elements 648 of the first plate 640, and (b) the bores 684 defined by the body 672 of the base 670; and (2) incorporation of the fasteners 690 that secure the flange elements 648 (and the first plate 640) to the base. In contrast to the second inter-subassembly connection, both third and fourth connections provide physical and electrical connections between the subassemblies defined by the base 670 and the MCS 610. In particular, the signal pins 613 of the power modules 612 being laser welded to the signal pin terminals 850, being secured to the base 670 as discussed in more detail with reference to FIGS. 5A and 5B, define the third inter-subassembly connection. The fourth inter-subassembly connection between the MCS 610 and the base 670 may be provided between the module terminals 617 and the raised edges 689 and bores 684 of the base 670. In some exemplary assembly processes, the module terminals 617 may be electrically connected to busbars (not shown). In addition, one or more of the bores 684 may house a nut or threaded insert below respective raised edges 689 to assist with attachment of the module terminals 617 to the base 670 with screws. Accordingly the raised edges 689 and portions of the base 670 defining the bores 684 may provide support and a mechanical nut for receiving a screw. In an example, module terminals 617 may be welded (laser welded) to the busbars (not shown) and the raised edges 689 and bores 684 will not receive screws, but provide support for the assembly process with the module terminals 617 and the busbars. In the above assembly processes involving the module terminals 617, attachment to the base 670 or use of the module terminals 617 as a support via the bores 684 and the raised edges 689 may occur after the MCS 610 has been tested for operational integrity.

FIG. 4A identifies the locations of longitudinal cross-sections of the power module assembly 600 where key components including the first and second plates 640, 650 are located. More specifically, lines 5A-5A, 5B-5B, and 5C-5C correspond to planes from which components responsible for securing the first and second plates 640, 650 to each other and to the base 670 can be viewed.

FIG. 4B identifies the locations of cross-sections of the power module assembly 600 that are orthogonal to the longitudinal axis and in which the force distribution capabilities of the plate system are exhibited. More specifically, lines 6A-6A, 6B-6B, 6C-6C, and 6D-6D correspond to planes from which components responsible for ensuring a distribution of forces applied to the second heatsink 630 and TIM between the first and second heatsinks 624, 630 are substantially uniform along the longitudinal axis of the power module assembly 600.

Figure 5B:
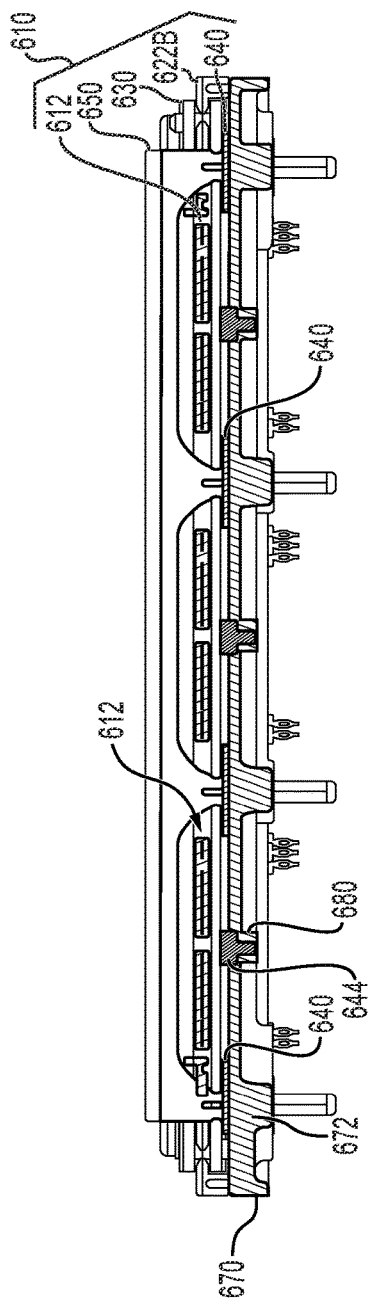
Figure 5C:
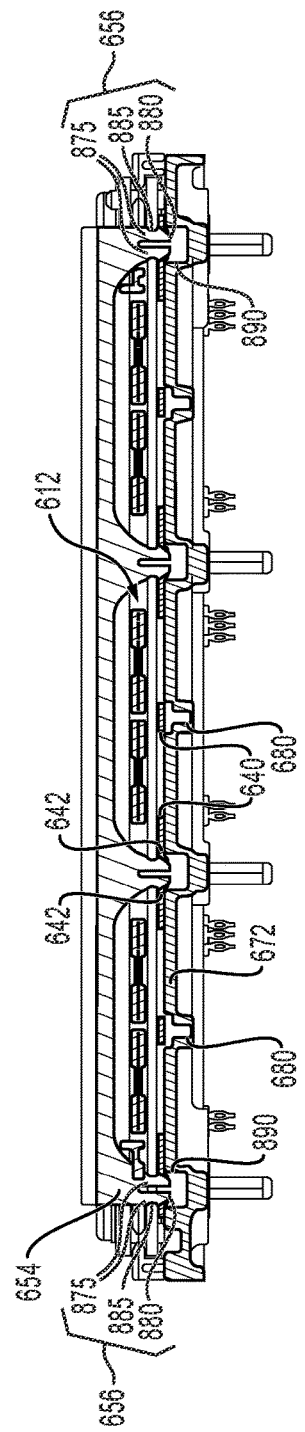

FIGS. 5A-5C depict cross-sectional views of the exemplary power module assembly of FIG. 3A from planes respectively corresponding to lines 5A-5A, 5B-5B, and 5C-5C in FIG. 4A. FIG. 5A depicts engagements between the signal pins 613 and the signal pin terminals 850. A discussion of the features illustrated in FIG. 5A is aided by the inclusion of FIG. 5D, which depicts an enlarged view of a portion of FIG. 5A that includes an engagement between one of the power modules 612 and the base 670 of the power module assembly 600.

Prior to an assembly process providing these engagements that define the third inter-subassembly connection between the base 670 and the MCS 610, the signal pin terminal 850 of each electrical connector 830 may be inserted into a respective pin slot 682 defined by the body 672 of the base 670. In one embodiment, an electrical connector 830 may be inserted into a respective pin slot 682 from above the base 670 such that a signal pin terminal 850 is at a right angle relative to a final position shown in FIG. 5D. Once the electrical connector 830 has been inserted through the pin slot 682 so that a tab 845 has moved past a bottom surface 805 of the base 670, the electrical connector 830 may be rotated to fit into a pin groove 860 formed on an upper surface 855 of the base 670 and corresponding to a respective pin slot 682.

In an embodiment, an electrical connector 830 may be provided in a flat configuration such that a respective signal pin terminal 850 is not disposed at a right angle relative to a connection pin 835 of the electrical connector 830. More generally, instead of having a 90° bend, the electrical connector 830 is straight. Subsequent to insertion, the signal pin terminal 850 may be manipulated to extend horizontally, or otherwise substantially parallel with a portion of the upper surface 855 of the base 670, and fitted into a pin groove 860 defined by protrusions 865 extending from the upper surface 855 as shown in FIG. 5D. Each pin groove 860 is able to accommodate a signal pin terminal 850 and a signal pin 613 from a power module 612.

As depicted in FIG. 5A, each electrical connector 830 includes a tab 845 extending between a respective signal pin terminal 850 and connection pin 835. Each tab 845 may interface with a bottom surface 805 of the base 670 to limit the extent to which the electrical connector 830 may be inserted from the bottom surface 805 through a respective pin slot 682, or otherwise limit movement of the electrical connector 830 toward the upper surface 855 of the base 670. In one embodiment, the pin slot 682 may be narrower in a portion configured to receive the tab 845 such that the tab 845 is friction-fitted into the pin slot 682.

FIG. 5B depicts the engagements between the first prongs 644 of the first plate 640 and the first engagement slots 680 of the base 670, which define the first inter-subassembly connection between the base 670 and the MCS 610. In one example, the first engagement slots 680 may be defined by the body 672 of the base 670 to have a profile that may include slight protrusions (not shown). Such protrusions may extend inwardly toward a center of a respective first engagement slot 680 sufficiently enough to engage with edges of a corresponding first prong 644. The edges may have protrusions as shown in FIG. 3C, may be curved, or may be provided in a configuration that promotes engagement with the first engagement slots 680.

Engagement between these structures may sufficiently secure the MCS 610 to the base 670 to the extent that other assembly and testing processes may be performed without having to use the fasteners 690 to secure the MCS 610 to the base 670. For example, it may be possible to test an electrical connection through the electrical connectors 830 and between an electrical component and the signal pins 613 for one, more than one, or all of the power modules 612, without first fastening the MCS 610 to the base 670 using the fasteners 690. In turn, significant time may be saved in assembling and installing a fully functional power module assembly 600.

As an example, it may be the case that testing of a power module assembly 600 reveals that one or more power modules 612 is not operating properly. With the first prongs 644 providing a primary physical connection between the base 670 and the MCS 610, removal and installation of another MCS 610 or a modified/repaired version of the test-failing MCS 610, the operations of removing and adding the fasteners 690 to the power module assembly 600 may be skipped completely.

FIG. 5C depicts the engagement between the second prongs 656 of the second plate 650 and the second engagement slots 642 of the first plate 640. As shown, distal ends 880 of each spring half 875 of each second prong 656 protrude through a corresponding second engagement slot 642 and at least partially into a third engagement slot 890 defined by the body 672 of the base 670. In addition, each second prong 656 defines one or more notches 885 on the side of each spring halve 875.

Figure 6A:
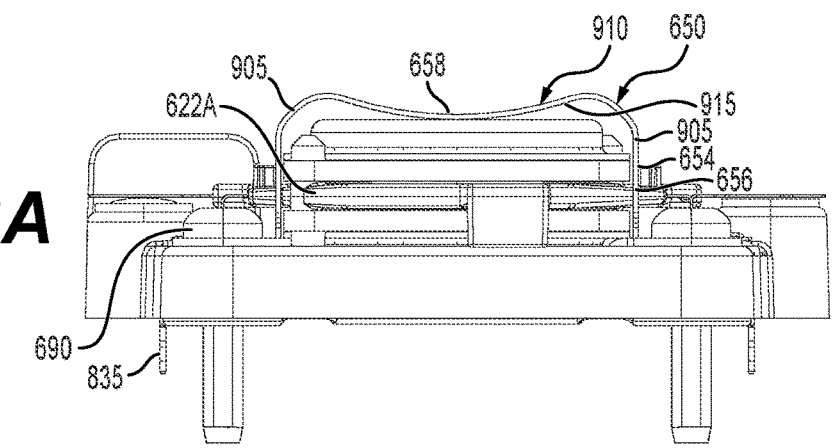
FIG. 6A depicts a front elevation view of an end of the exemplary power module assembly of FIG. 3A, from a plane corresponding to line 6A-6A in FIG. 4B, according to one or more embodiments.
Figure 6B:
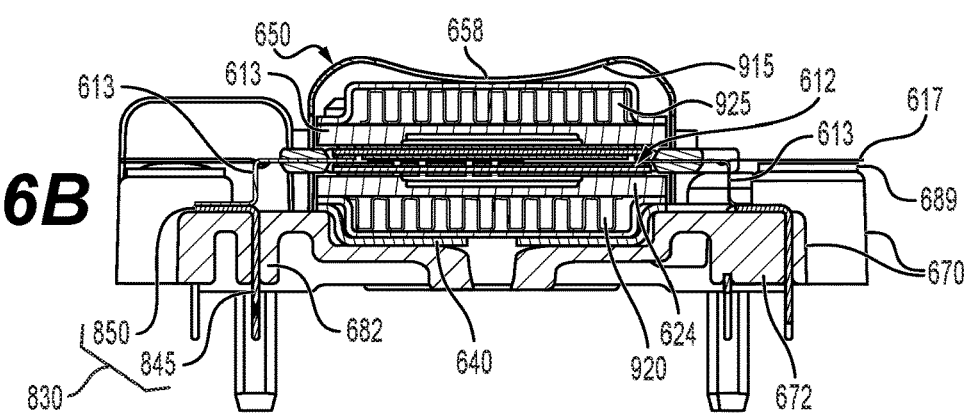
FIGS. 6B-6D depict cross-sectional views of the exemplary power module assembly of FIG. 3A from planes respectively corresponding to lines 6B-6B, 6C-6C, and 6D-6D in FIG. 4B, according to one or more embodiments.
Figure 6C:
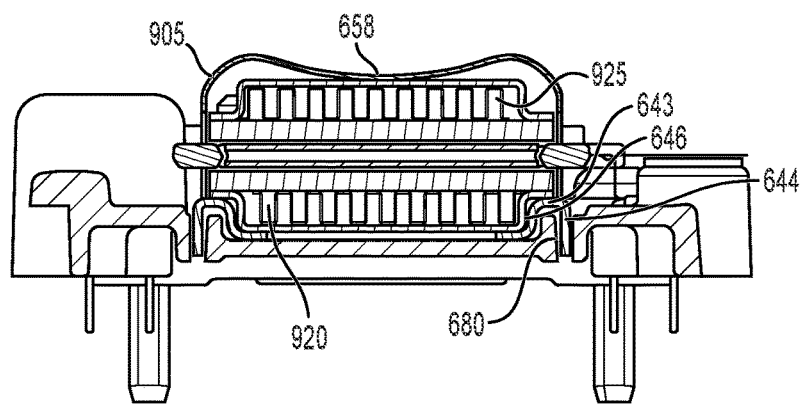

In one embodiment, the slight protrusion of the distal ends 880 of the second prongs 656 through the second engagement slots 642 and into corresponding third engagement slots 890 of the base 670 as shown in FIG. 6C may serve to align the MCS 610 onto the base 670. In an embodiment, as a second prong 656 is passed or pressed through a corresponding second engagement slot 642 in the first plate 640 (e.g., when the second plate 650 is pressed toward the base 670), the spring halves 875 may contract toward one another until respective notches 885 receive an inner edge of a respective second engagement slot 642 of the first plate 640.

The spring halves 875 may be sized to be longer and/or to have more than one notch 885 formed on the edges thereof. In one or more embodiments, the distal ends 880 of the second prongs 656 may extend to different depths in the base 670 depending on respective lengths and sizes (e.g., thickness) of various components of the MCS 610. Depending on the size (e.g., thickness) of heatsinks, substrates or lead frames for power modules, TIM between heatsinks, gasket or supports, an implementation of the second plate 650 may include pressing the second plate 650 such that notches 885 of each of the second prongs 656 engage with inner edges of respective second engagement slots 642 and the second plate 650 applies a downward force on components of the MCS 610 over which the second plate 650 is disposed. An example result of pressing the second plate 650 is depicted in FIGS. 7A and 7B.

Additional advantages of an exemplary plate system including the first and second plates 640, 650 will now be discussed with reference to FIGS. 6A-6D and 7A-7B.

Figure 6D:
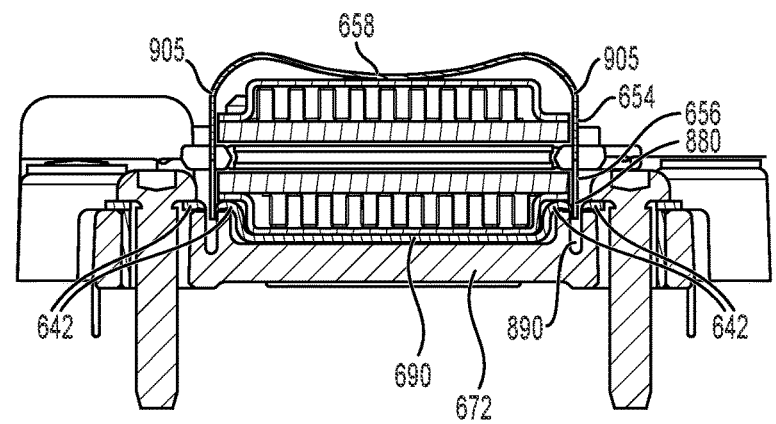

FIG. 6A depicts a front elevation view of an end of the exemplary power module assembly of FIG. 3A, from a plane corresponding to line 6A-6A in FIG. 4B. FIGS. 6B-6D depict cross-sectional views of the exemplary power module assembly of FIG. 3A from planes respectively corresponding to lines 6B-6B, 6C-6C, and 6D-6D in FIG. 4B. FIG. 7A depicts a front elevation view of an end of the power module assembly 600 with the second plate 640 having been pressed such that the third ribs 658 are pressed so that the second prongs 656 are positioned relative to the second engagement slots 642 as shown in FIG. 7B.

As shown in FIG. 6A, the second plate 650 includes a concave shaped third rib 658 that extends between two transition walls 905 and is curved downward such that a heatsink facing inner surface 915 of a trough 910 defined by the third rib 658 is in contact with an upper surface of the second heatsink 630.

According to one embodiment, the second plate 650 may be formed from a metal material and be configured to apply a downward force onto a surface or body positioned below the inner surface (e.g., with a downward directed material bias). More specifically, the third ribs 658 of the second plate 650 may exhibit a shape memory material bias and thereby be configured to elastically deform where: the second plate 650 is positioned on another structure, such as a heatsink, with the inner surface 915 facing the structure, and a force is applied to a surface of the second plate 650 opposite to the inner surface 915 and the structure. Such a force may cause the transition walls 905 to move in a direction toward the structure and the plate wall 652 to flatten against the structure. In an example, an external force may be applied to the inner surfaces 915 of the plate wall 652 (inner surfaces the third ribs 658), and the plate wall 652 may elastically deform (e.g., like a plate spring) from a curved shaped as depicted in FIGS. 6A-6D.

In addition, FIG. 6A provides a view of the first support 622A from which a significant function of this component may be appreciated. That is, the first support 622A (and second support 622B) ensures that there is a structure that maintains some space between the first and second heatsinks 624, 630 and may prevent damage to various components if an excessive or prolonged force is applied to the second plate 650. FIGS. 7A and 7B depict the power module assembly 600 after the second plate 650 has been pressed, so that the spring halves 875 of the second prongs 656 contract, distal ends 880 of the second prongs 656 pass through the second engagement slots 642, the spring halves 875 expand, and the notches 885 engage inner walls of the first plate 640 that define the second engagement slots 642. Absent the first and second supports 622A, 622B, applying a force on the second plate 650 in excess of what is required to result in the engagement depicted in FIG. 7B, could result in the second heatsink 630 compressing, crushing, or otherwise damaging one or more of the power modules 612.

FIG. 6B depicts, in particular, electrical connectors 830 disposed in pin slots 682 of the base 670. FIG. 6C depicts first prongs 644 of the first plate 640 engaged with first engagement slots 680 of the base 670. FIG. 6D depicts, among other things, distal ends 880 of the second prongs 656 of the second plate 650, extending just past the second engagement slots 642 of the first plate 640 and into an uppermost portion of the third engagement slots 890 defined in the body 672 the base 670.

FIG. 7A depicts a front elevation view of an end of the power module assembly 600 after the second plate 650 has been pressed and the second prongs 656 for the second plate 650 are positioned in the second engagement slots 642 as shown in FIG. 7B. The second prongs 656 of the second plate 650 extend from legs 654 that extend from transition walls 905 connected by the plate wall 652 that spans across at least a channel containing portion of the second heatsink 630. As noted above and shown in FIG. 7B, the notches 885 of the expanded spring halves 875 engage inner walls of the first plate 640 that define the second engagement slots 642. This engagement secures the second plate 650 to the first plate 640 in the position depicted in FIG. 7A.

Unlike the second plate 650 as illustrated in FIG. 6A, a majority of inner surfaces 915 of the third ribs 658 are in contact with an exposed surface of the second heatsink 630. Furthermore, as shown in FIG. 7A, the transition walls 905 define more of a right angle corner than their rounded shape depicted in FIGS. 6A-6D. In addition to the other advantages discussed herein, this may provide a compact assembly with favorable resistance to vibrations.

From each of FIGS. 6B-6D, it can be appreciated that the second plate 650 provides a plurality of the third ribs 658 that, when the second plate 650 is pressed into the configuration shown in FIG. 7A, may combine to apply a uniformly distributed force on the second heatsink 630 along the longitudinal axis of the power module assembly 600. This application of force serves several purposes, including but not limited to: removing the need for heatsink tabs; facilitating an advantageous (e.g., even) distribution of TIM; and improved sealing between components.

Regarding heatsink tabs, these features may be used to secure heatsinks to other components. However, eliminating a need for the tabs also removes the possibility they will be deformed during assembly or handling, which may result in improve thermal performance by the heatsinks. Regarding TIM distribution, in some electrical components that include multiple power modules and incorporate TIM between surfaces, some areas of application may receive or otherwise retain more TIM relative to other areas. As a result, thermal performance between these areas may differ and result in hot spots developing within electrical components.

However, in one example, the first and second plates 640, 650 may be assembled to the first and second heatsinks 624, 630 and power modules integrated therein, before, or immediately after TIM is injected, dispersed, provided, or otherwise introduced between the first and second heatsinks 624, 630. An application of a force on the second plate 650 may aid in providing an even distribution of TIM between the first and second heatsinks 624, 630, and between the first and second heatsinks 624, 630 and the power modules 612. More specifically, with a distributed force applied by the second plate 650 on the remainder of the MCS 610 along the longitudinal axis, the TIM may be distributed more evenly between the first and second heatsinks 624, 630, along the longitudinal axis, and across a width of the heatsinks. Accordingly, the first and second plates 640, 650 may minimize the opportunities for TIM to concentrate in some areas and be sparsely provided in others, and reduce the opportunities for hot spots to develop within the power module assembly 600 due to an uneven spread of TIM. Pressing the second plate 650 from a state depicted in FIG. 6A to, for example, a state depicted in FIG. 7A, may enhance sealing action between components and their respective interfaces, which may minimize the opportunities for leaks to develop.

One of ordinary skill in the art will appreciate that first and second channels 920, 925 depicted in FIGS. 6B-6D, provide coolant pathways. More specifically, the coolant that enters the first port 626 (see FIG. 3B) of the first heatsink 624 and does not flow into the first port 634 (see FIG. 3C) of the second heatsink 630, may be conveyed through the first channels 920 across the first heatsink 624. As this coolant passes through first channels 920, heat from the power modules 612 may be dissipated through the first heatsink 624 (in particular, with the sections of the first channels 920 corresponding to the first contact interface 625 shown in FIG. 3B), and transferred to the coolant in the first channels 920.

FIGS. 6B-6D also depict how at least a portion of the first heatsink 624 is disposed between the sides of the recessed wall 676 of base 670 below the upper surface 855. Thus, at least a portion of the first heatsink 624 is disposed within the base 670. One of ordinary skill in the art will recognize that the recessed wall 676 is configured such that the first heatsink 624 could be received in/on the recessed wall 676 without the first plate 840. In one or more embodiments, the base 670, cooling system 620, and the power modules 612 may be provided without the first and second plates 640, 650. In this example, electrical connections between the power modules 612 and a substrate may still be provided through connections between the signal pins 613 and the electrical connectors 830 within the base.

The remaining coolant that enters the first port 626 of the first heatsink 624 and enters the first port 634 of the second heatsink 630, may enter and be conveyed through second channels 925 depicted in FIGS. 6B-6D. Similar to the coolant in the first heatsink 624, as this coolant passes through second channels 925, heat from the power modules 612 may be dissipated through the second heatsink 630 (in particular, with the sections of the second channels 925 corresponding to the second contact interfaces 632 shown in FIG. 3C), and transferred to the coolant in the second channels 925.

The above discussion provides a description of an exemplary function of the cooling system 620 for the power module assembly 600 that may be referred to as double-sided active cooling of the power modules 612. Regardless of the designation, it will be noted that circulating coolant above and below the power modules 612 may be more effective at cooling the power modules 612 than, for example, passive cooling solutions, single sided active cooling solutions, or combinations of these solutions. However, it will be noted that the exemplary plate systems including first and second plates as described herein may be incorporated in implementations that utilized the other types of electrical component cooling solutions.

In general, double-sided cooling solutions increase a number of design considerations that if unaddressed, may result in problematic issues arising as operations of an electrical component including multiple power modules are carried out. For example, relative to a single-sided cooling solution, double-sided cooling solutions may have a greater volume of fluid flowing near: (1) critical sub-components of an electrical component including one or more power modules; and (2) joints, connections, and interfaces between sub-components. As a result, there may be an increased chance of leak points developing in electrical components that include multiple power modules and a double-sided cooling solution. As discussed below with reference to FIGS. 6A-6D and 10A-10B, exemplary power module assemblies according to the present disclosure include plate systems that may address design considerations associated with leaks.

However, the power module assembly 600 benefits from a tight construction, particularly once the second plate 650 is pressed into the configuration illustrated in FIG. 7A. The enhanced tightness/compactness of the arrangement of components provided by pressing the second plate 650 as discussed, may minimize gaps between components, in either a static environment or as a result of forces applied to various surfaces by coolant as the coolant flows through the first and second heatsinks 624, 630. The combination of the first and second plates 640, 650, and uniform distribution of force applied thereby, provides an exemplary solution that enhances the sealing between, for example: the first and second gaskets 621A, 621B and the first and second heatsinks 624, 630; the first and second supports 622A, 622B and the first and second heatsinks 624, 630; and between the MCS 610 and a substrate, such as a PCB incorporated in an electric vehicle.

Additional advantages of exemplary power module assemblies according to various aspects of the present disclosure, as respective combinations of MCS and base subassemblies, will now be discussed with reference to FIGS. 8A-8B. FIG. 8A depicts an isometric view of an exemplary module and cooling system subassembly 1110

Figure 9A:
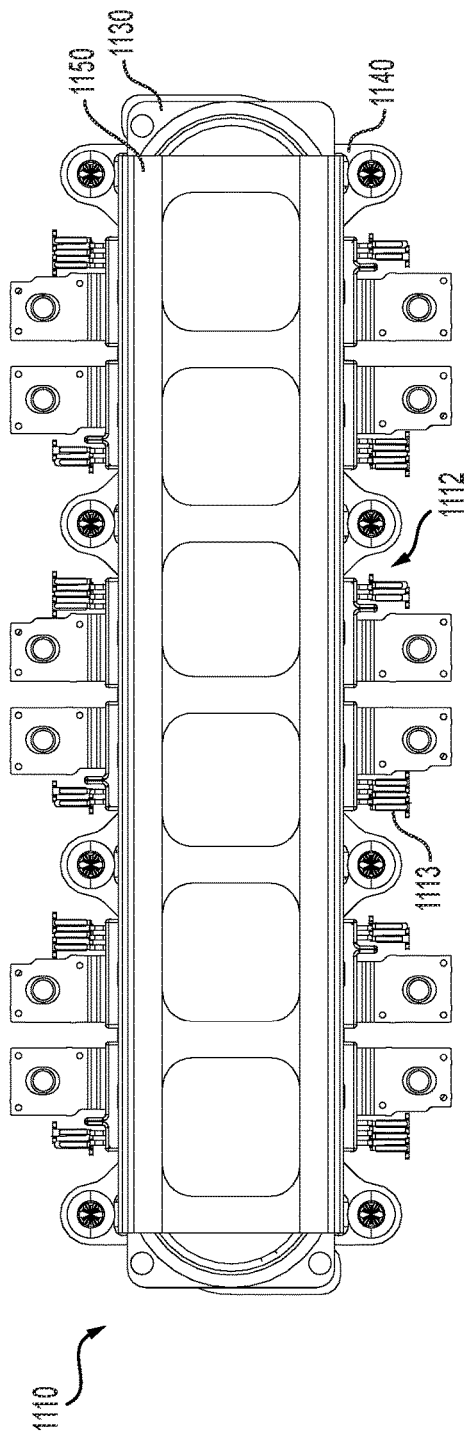
FIGS. 9A and 9B depict overhead and bottom views of the subassembly of FIG. 8A, according to one or more embodiments.
Figure 9B:
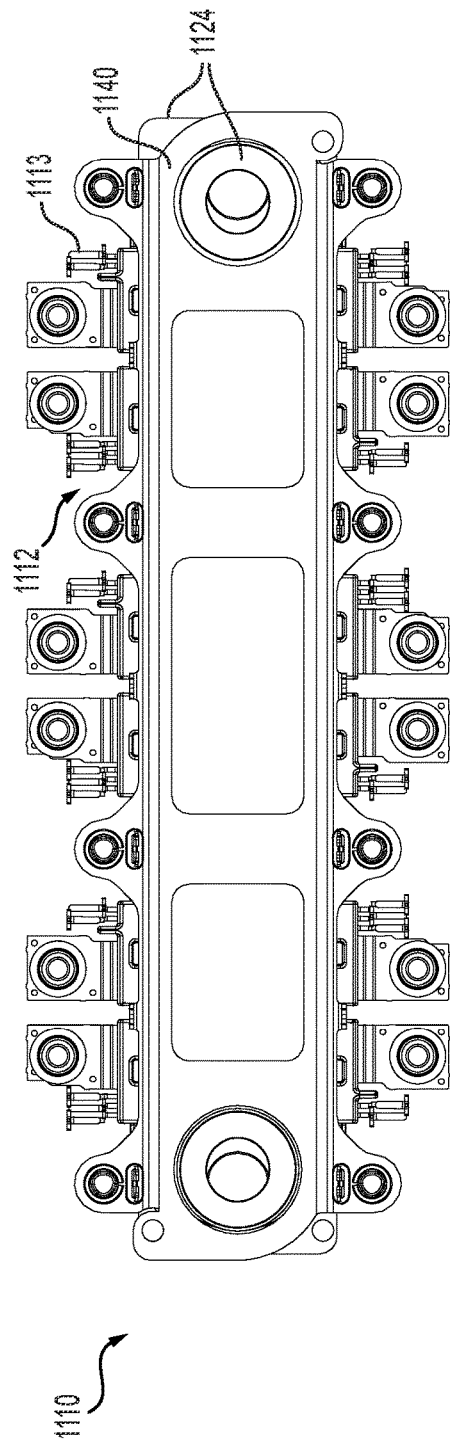

("MCS 1110"), according to one or more embodiments. FIG. 8B depicts an isometric view of an exemplary base 1170 for a power module assembly, according to one or more embodiments. FIGS. 9A and 9B depict overhead and bottom views of MCS 1010 of FIG. 8A. FIGS. 9A and 9B depict overhead and bottom views of the subassembly of FIG. 8B.

All advantages of the exemplary power module assemblies described herein are respectively applicable to MCS 1110 and base 1170 subassemblies respectively depicted in FIGS. 8A-13B, and vice versa. Generally, exemplary configurations of plates, such as first and second plates 1140, 1150 of the MCS 1110 depicted in FIGS. 8A, 9A, and 9B, provide low-complexity, modular structures configured to apply substantially uniform distributed forces on heatsinks. Furthermore, MCS and base subassemblies according to the present disclosure, may facilitate three different methods of assembly and testing. Each of the following methods potentially having advantages that minimize the likelihood that power modules are scrapped during production, depending on the tools, time, and materials that are available, and/or other conditions that persist at a time when a power module assembly, MCS subassembly, and/or base are assembled. However, each method is facilitated, at least in part, by the flexibility provided by: (1) first and second plates 1140, 1150, and (2) the base 1170, which is depicted in FIGS. 8B, 10A, and 10B.

The first and second plates 1140, 1150 obviate the need for multiple clamps to provide a testable intermediate assembly. With multiple clamps, four or more individual clamps may be need to be attached, one at a time, around a stack of components that may include multiple heatsinks and power modules. Each clamp therefore represents an opportunity for some portion of an overall assembly to become disassembled before, during, or after testing. In contrast, with the first and second plates 1140, 1150, heatsink and power module components may be positioned on top of the first plate 1140, and the second plate 1150 may be placed on the combination of components and pressed into engagement with the first plate 1140. Accordingly, instead of having to incorporate four or more clips before an assembly can be tested electrically to confirm effective thermal contact has been achieved, the exemplary power module assemblies described herein may use one addition of two plates to a combination of components.

On the other hand, the base 1170 does not have to be assembled to the MCS 1110 prior to installation on a substrate. Instead, the base 1170 provides an intermediate support structure that may be installed on the MCS 1110 before substrate installation, or installed on the substrate before MCS 1110 attachment. This is because instead of aligning signal pins from the MCS 1110 for connection to a substrate, the base 1170, as discussed above with reference to FIG. 5D, may provide an intermediate portion of an electrical connection between the MCS 1110 and a substrate. Furthermore, connection pins extending from the base 1170 may be easier to locate onto a substrate than, for example, signal pins from an assembly that extend through another component.

In one example, the MCS 1110—first and second heatsinks 1124, 1130, power modules 1112, and first and second plates 1140, 1150—may be built and tested. Assuming satisfactory testing, the MCS 1110 may then be assembled to the base 1170. Laser welding may be used to connect signal pins 1113 of the power modules 1112 to signal pin terminals 1172 of the base 1170. Subsequent to assembling the MCS 1110 to the base 1170, this combination of subassemblies, which define an exemplary power module assembly according to the present disclosure, may be installed into a substrate, such as a PCB incorporated into an electric vehicle. In one example, installation may be carried out with a compliant pin (e.g., pin pressing) approach, using electrical connectors and connection pins thereof, or a soldering approach.

In an example, the MCS 1110—first and second heatsinks 1124, 1130, power modules 1112, and first and second plates 1140, 1150—may be built, and assembled to the base 1170. Laser welding may be used to connect signal pins 1113 of the power modules 1112 to signal pin terminals 1172 of the base 1170. Subsequent to assembling the MCS 1110 to the base 1170, the power module assembly defined thereby may be tested. Assuming testing reveals a successful assembly, the satisfactory power module assembly may be installed into a substrate using connection pins 1174 of the base and a compliant pin or solder approach.

In an example, the MCS 1110—first and second heatsinks 1124, 1130, power modules 1112, and first and second plates 1140, 1150—may be built and tested. Before, during, or after the MCS 1110 is built and tested, the base 1170 may be installed, without the MCS 1110, into the substrate. A compliant pin or soldering approach may be utilized to install the base 1170 into the substrate. Regardless of when the MCS 1110 is built and tested, the final process in this method may include assembling the MCS 1110 to the base 1170, which is already installed in the substrate.

Figure 11:
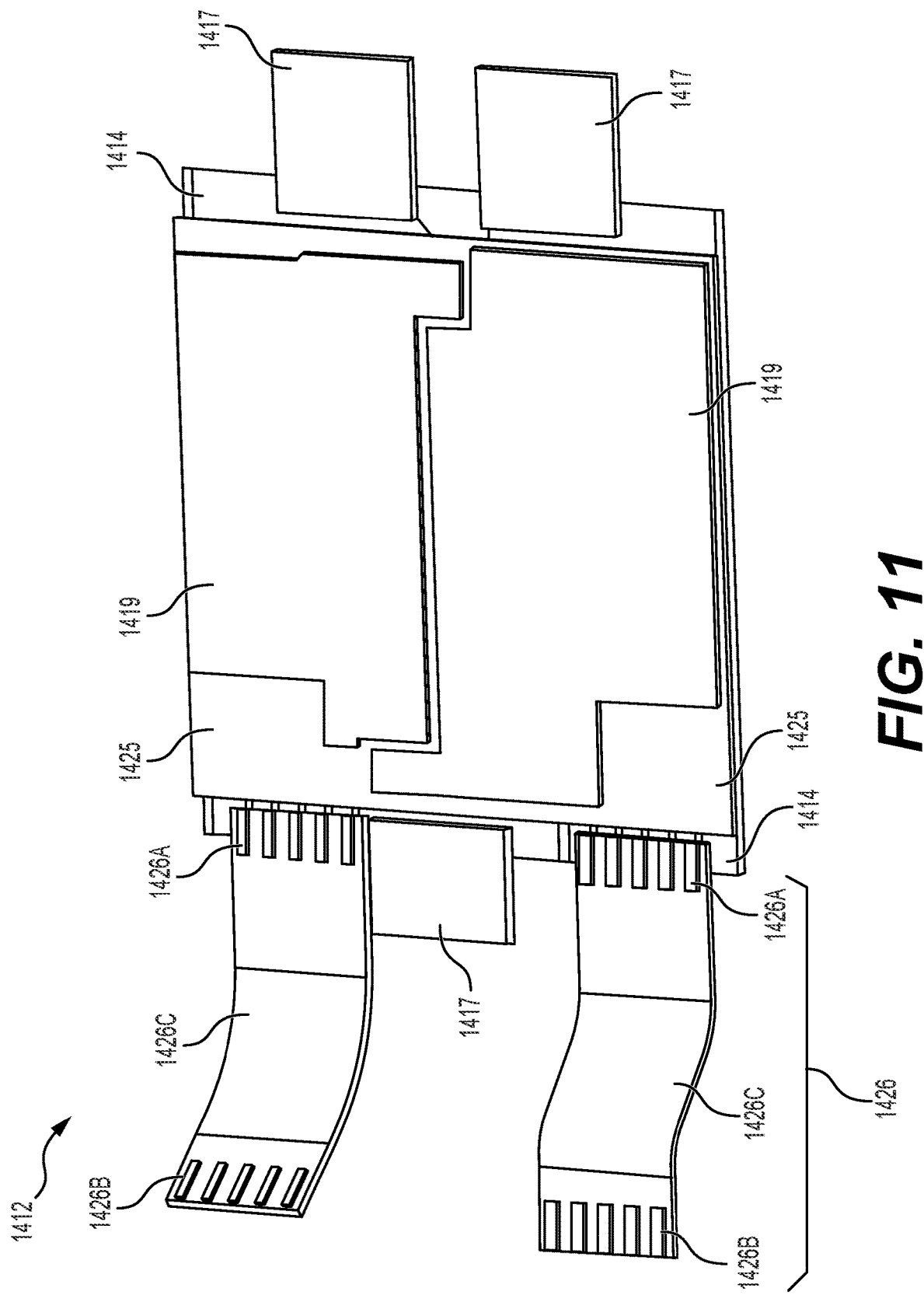
FIG. 11 depicts an overhead view of an exemplary power module, according to one or more embodiments.

FIG. 11 depicts and overhead view of an exemplary power module 1412, according to one or more embodiments. As shown, the power module 1412 may include a substrate 1414, a ceramic layer 1425 to which a lead frame (not shown) may be attached or otherwise provided, and several terminals 1417 extending from the substrate 1414 and the ceramic layer 1425. A metallization layer 1419 may be attached to the ceramic layer 1425. In one embodiment, instead of individual pins being soldered or welded to the power module 1412, flexible connections 1426 may be provided for signal routing of power switches (e.g., dies—not shown).

Each flexible connection 1426 may include: a first end 1426A that may be soldered or welded to an exposed portion of the substrate 1414; a second end 1426B that may be attached to a base, such as the exemplary bases described herein, or directly to a substrate (e.g., a PCB); and a flexible connector 1426C connecting the first end 1426A and the second end 1426B. The flexible connector 1426C may be provided by flex or wires. Each flexible connection may be soldered, welded, or plugged into a base or substrate.

Such a configuration for a power module including flexible connections, such as the power module 1412 with flexible connections 1426 depicted in FIG. 11, may substantially increase installation flexibility. This may be true for processes that involve installing or replace power modules within a cooling system, such as the cooling system 620 of the power module assembly 600, or a module and cooling system such as MCS 610 and MCS 1110. Furthermore, installations of entire power module assemblies including the exemplary power module 1412 depicted in FIG. 11, onto either a base, such as base 670 or base 1170, or directly on to a substrate, may be simplifier, faster, and less labor intensive relative to installations of power module assemblies that do not employ flexible connections attached to power modules.

In addition, a configuration of a system comprising, for example, an exemplary power module assembly as described herein, and a substrate, may be changed with little complications. For example, an MCS including the power module 1412 for respective power modules, may be transition from a system wherein the MCS is attached to a base, to another substrate or portion of the system to which the MCS is directly plugged into a substrate.

FIGS. 12-15 depict isometric views of plates, according to one more embodiments. FIGS. 16A and 16B depict isometric and front elevation views of a plate, according to one more embodiments.

As shown in FIG. 12, a plate 1500 may include apertures 1505 provided in flange elements extending from bottom edges of stepped walls 1510 that are linked by a plate wall 1515. In one embodiment, a first surface 1520 of the plate wall 1515 includes a series of protrusions 1530 that extend perpendicular to a longitudinal axis of the plate 1500. A second surface (not shown) of the plate 1500 may be flat or include corresponding protrusions. Alternatively, as shown in FIG. 13, a plate 1600 may include protrusions 1630 that extend along with and parallel to a longitudinal axis of the plate 1600. In an embodiment, such as a plate 1700 of FIG. 14, protrusions 1730 may be provided in a cross pattern. In an embodiment, a plate, such as a plate 1800 of FIG. 15 or a plate 1900 of FIG. 16A, may not include protrusions. However, as shown in FIG. 16B, a plate wall 1915 may be curved between respective stepped walls 1910.

Exemplary first and/or second plates described herein may incorporate features from one or more of the plates depicted in FIGS. 12-16B. Certain features of first and second plates described herein may be incorporated in any of the plates depicted in FIGS. 12-16B. For example, any of the plates depicted in FIGS. 12-16B may be formed with first prongs, second engagement slots, or legs and second prongs as described herein. In one or more embodiments, one of the plates depicted in FIGS. 12-16B may be substituted for a first plate or a second plate of one or more of the exemplary power module assemblies according to the present disclosure.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A base for an electrical component, the base comprising:
   a body, the body defining:
      a rim,
      pin slots, and
      first engagement slots;
   contact terminals; and
   electrical connectors, each of the electrical connectors being positioned within a respective pin slot and including a pin terminal positioned on a first surface of the body;
   wherein the base is configured to provide an electrical connection between one or more power modules and a substrate.

2. The base of claim 1, wherein the first engagement slots are configured to receive prongs secured to the one or more power modules and secure the one or more power modules to the substrate.

3. The base of claim 1, wherein the body further defines first and second apertures configured to receive first and second fittings of a heatsink.

4. The base of claim 1, further comprising:
   fasteners configured to secure the base to the substrate,
   wherein the body defines apertures within the rim configured to receive the fasteners.

5. The base of claim 1,
   wherein the body further defines second engagement slots, and
   wherein the first engagement slots are configured to receive first prongs and the second engagement slots are configured to receive second prongs different from the first prongs.

6. The base of claim 1, wherein the base is configured to provide the electrical connection with one or more of the contact terminals or respective pin terminals of the electrical connectors.

7. The base of claim 6, wherein one or more of the contact terminals is configured to be electrically connected to a terminal of the one or more power modules.

8. The base of claim 6, wherein the pin terminals are configured to be electrically connected to signal pins of the one or more power modules.

9. The base of claim 1, wherein each electrical connector includes a connection pin that extends from a respective pin terminal and is disposed in a pin slot corresponding to the electrical connector.

10. The base of claim 9,
    wherein each pin slot is configured to receive a tab of a respective connection pin disposed in the pin slot, and
    wherein the tab is configured to limit movement of a respective electrical connector toward the first surface.

11. The base of claim 9, wherein connection pins of the electrical connectors extend from respective pin slots through a second surface of the base.

12. The base of claim 9,
    wherein the body defines protrusions extending from the first surface, and
    wherein the protrusions define pin grooves configured to receive respective pin terminals of the electrical connectors.

13. The base of claim 9,
    wherein the body defines pin grooves on the first surface, and
    wherein each pin groove is configured to receive a pin terminal of an electrical connector and a signal pin of the one or more power modules.

14. An electrical component comprising:
    a cooling system;
    a plurality of power modules integrated into the cooling system; and
    a base including:
       a body defining a rim and a recessed wall surrounded by the rim, contact terminals, and
       electrical connectors including terminal and pin components, the electrical connectors extending through the rim;
    wherein the body accommodates a portion of the cooling system within the recessed wall and is configured to extend between the cooling system and a substrate, and
    wherein the base is configured to provide electrical connections between the plurality of power modules and the substrate.

15. The electrical component of claim 14,
    wherein each electrical connector includes a pin terminal and a connection pin disposed in a pin slot,
    wherein each pin terminal is positioned on a first surface of the body facing the cooling system and each connection pin extends through a second surface of the body configured to face the substrate.

16. The electrical component of claim 14,
wherein each electrical connector includes a pin terminal positioned on a surface of the rim,
wherein each contact terminal is positioned next to one or more electrical connectors,
wherein signal pins of the plurality power modules are electrically connected to pin terminals of the electrical connectors, and
wherein terminals of the plurality of power modules are electrically connected to the contact terminals of the base.

17. The electrical component of claim 14,
wherein the cooling system includes a first heatsink and a second heatsink,
wherein the plurality of power modules are positioned between the first heatsink and the second heatsink.

18. The electrical component of claim 14, wherein the cooling system includes one or more active cooling heatsinks.

19. The electrical component of claim 18,
wherein the body of the base further defines first and second apertures in the recessed wall,
wherein the first aperture accommodates a first fluid connection to an inlet of the active cooling heatsink and the second aperture accommodates a second fluid connection to an outlet of the active cooling heatsink.

20. A subassembly for an electrical component comprising:
a first heatsink;
a second heatsink;
a plurality of power modules positioned between the first heatsink and the second heatsink; and
a base including:
a body, the body defining:
a rim,
a recessed wall surrounded by the rim,
pin slots, and
first engagement slots;
contact terminals; and
electrical connectors including terminal and pin components, each of the electrical connectors being positioned within a respective pin slot and including a pin terminal positioned on a first surface of the body;
wherein one or more of the contact terminals or the electrical connectors is configured to provide electrical connections between the plurality of power modules and a substrate, and
wherein the first heatsink is positioned within the recessed wall of the base.

* * * * *